(12) United States Patent
Kim et al.

(10) Patent No.: US 9,240,162 B2
(45) Date of Patent: Jan. 19, 2016

(54) TRANSPARENT DISPLAY APPARATUS AND METHOD FOR CONTROLLING THE SAME

(71) Applicant: LG Display Co., Ltd., Seoul (KR)

(72) Inventors: IlHo Kim, Paju-si (KR); YoungHoon Noh, Paju-si (KR); ByungChun Yu, Paju-si (KR); Seongmin Choi, Gwangju (KR)

(73) Assignee: LG Display Co., Ltd., Seoul (KR)

( * ) Notice: Subject to any disclaimer, the term of this patent is extended or adjusted under 35 U.S.C. 154(b) by 87 days.

(21) Appl. No.: 14/140,184

(22) Filed: Dec. 24, 2013

(65) Prior Publication Data

US 2014/0184577 A1  Jul. 3, 2014

(30) Foreign Application Priority Data

Dec. 31, 2012 (KR) .......................... 10-2012-0157791

(51) Int. Cl.
 *G09G 5/10* (2006.01)
(52) U.S. Cl.
 CPC ........................................ *G09G 5/10* (2013.01)
(58) Field of Classification Search
 CPC ............. G09G 3/36; G09G 5/02; G09G 3/30; G09G 5/10; G02F 1/1333
 USPC .......................................................... 345/207
 See application file for complete search history.

(56) References Cited

U.S. PATENT DOCUMENTS

| | | | | |
|---|---|---|---|---|
| 2005/0122053 | A1* | 6/2005 | Ko | H01L 27/3232 315/169.3 |
| 2010/0053993 | A1 | 3/2010 | Hong et al. | |
| 2012/0070085 | A1* | 3/2012 | Arn | H04N 7/185 382/173 |
| 2012/0327331 | A1* | 12/2012 | Yim | G02F 1/1362 349/62 |
| 2013/0048837 | A1* | 2/2013 | Pope | G01J 1/0422 250/214.1 |

FOREIGN PATENT DOCUMENTS

| | | |
|---|---|---|
| KR | 10-2007-0040087 A | 4/2007 |
| KR | 10-2010-0027417 A | 3/2010 |
| KR | 10-2011-0001545 A | 1/2011 |
| WO | WO-2005/024501 A1 | 3/2005 |

OTHER PUBLICATIONS

PCT International Search Report for PCT/KR2013/012362, Apr. 16, 2014, 3 Pages.

* cited by examiner

*Primary Examiner* — Aneeta Yodichkas
*Assistant Examiner* — Chineyere Wills-Burns
(74) *Attorney, Agent, or Firm* — Fenwick & West LLP

(57) ABSTRACT

There are provided a transparent display apparatus and a method for controlling the same. The transparent display apparatus includes a transparent display unit that includes an emissive area and a transmissive area and is configured to display a video, an optical sensor configured to measure the amount of light, and a light shielding unit that is disposed on one surface of the transparent display unit and is configured to adjust transmittance on the basis of the amount of light.

15 Claims, 13 Drawing Sheets

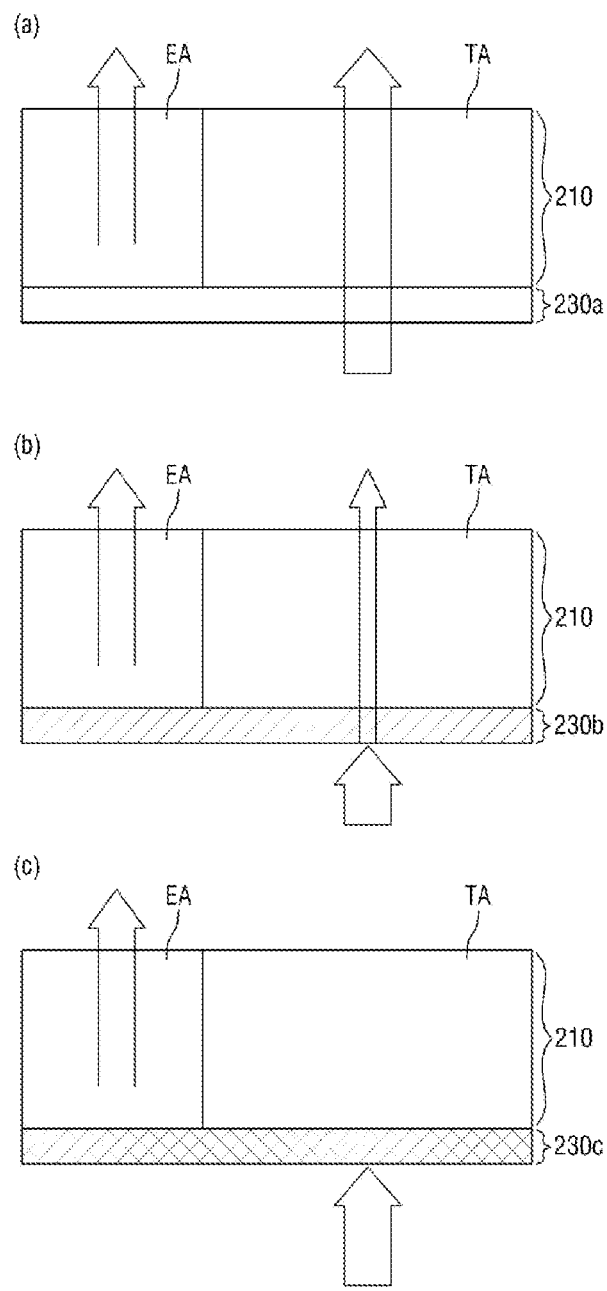

Fig 2d
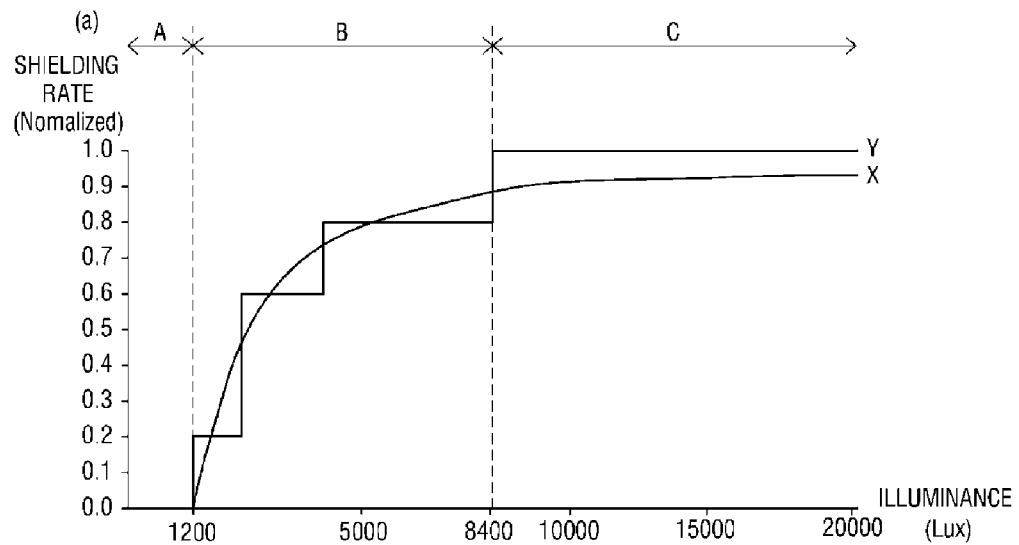
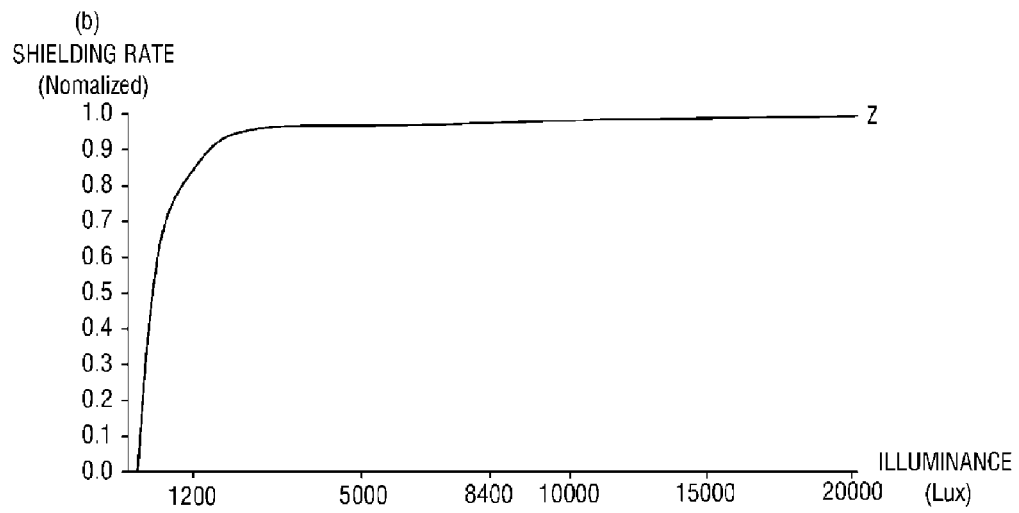

Fig 3
(a)
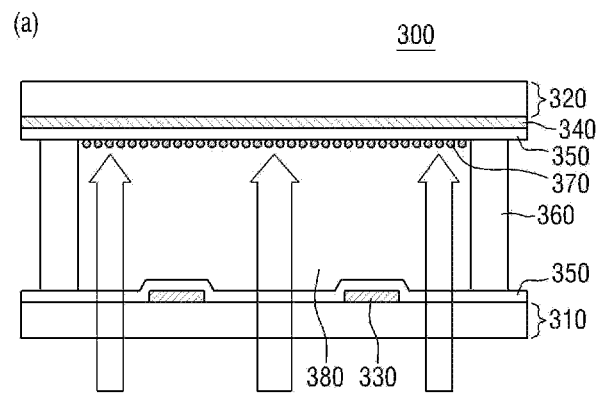
(b)
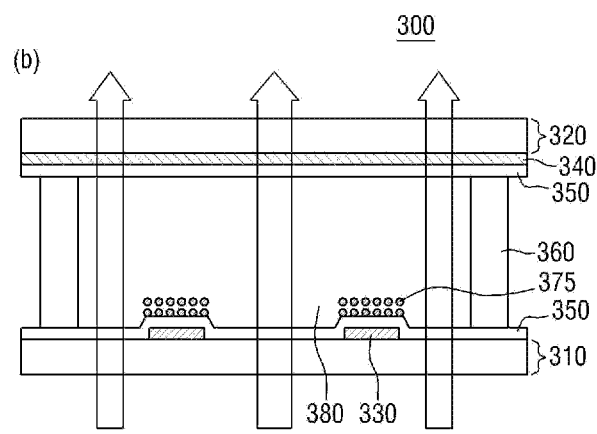

TRANSPARENT DISPLAY APPARATUS AND METHOD FOR CONTROLLING THE SAME

CROSS-REFERENCE TO RELATED APPLICATIONS

This application claims the priority of Korean Patent Application No. 10-2012-0157791 filed on Dec. 31, 2012 in the Korean Intellectual Property Office, the disclosure of which is incorporated herein by reference in its entirety.

BACKGROUND OF THE INVENTION

1. Field of the Invention

The present invention relates to a transparent display apparatus and a method for controlling the same, and more particularly, to a transparent display apparatus and a method for controlling the same with which it is possible to improve visibility by shielding incident light on the basis of an analysis of an ambient environment of the transparent display apparatus.

2. Description of the Related Art

A transparent display apparatus is a display apparatus in which a background of a screen is transparently seen, and the transparent display apparatus is primarily realized by projecting a video on a transparent screen in the past. However, there has been currently developed a display apparatus that directly includes a transparent display device. Since a liquid-crystal display (LCD) uses two polarizing plates, the liquid-crystal display has low transmittance, so that it is difficult to be used as a transparent display apparatus. The transparent display apparatus is mostly realized in an organic light-emitting display device (OLED) capable of self-emitting, especially. Such a transparent display apparatus is applied to a front glass for a vehicle or a glass for home to provide desired information to a user.

SUMMARY OF THE INVENTION

Embodiments of the present disclosure relate to a transparent display apparatus having a transmittance that is adjusted as external light incident on the display changes. In one embodiment, the transparent display apparatus comprises a transparent display unit having light emitting pixel elements and transmitting at least a portion of first light incident on the transparent display apparatus. At least one sensor generates at least one signal indicative of brightness of second light incident on the transparent display apparatus. The portion of the first light transmitted through the transparent display unit is adjustable based on the signal indicative of the brightness of the second light.

In one embodiment, the transparent display apparatus includes a light control unit overlapping with the transparent display unit. The light control unit has an adjustable transmittance for the first light and can adjust an amount of the portion of the first light transmitted through the transparent display unit by adjusting the adjustable transmittance of the light control unit based on the signal indicative of the brightness of the second light.

In one embodiment the first light is the same as the second light. For example, both the first and second light may be from an external light located at a back surface of the display apparatus. In another embodiment, the first light and the second light may be different and are incident on opposite surfaces of the transparent display apparatus.

In one embodiment the at least one sensor comprises a plurality of sensors that generate a plurality of signals indicative of the brightness of the second light at different positions of the transparent display apparatus, and the adjustable transmittance of the light control unit is adjustable in different areas corresponding to the different positions of the transparent display apparatus based on the plurality of signals.

In one embodiment, the at least one sensor also measures a proximity between the transparent display apparatus and an external object, and the portion of the first light transmitted through the transparent display unit is further adjustable based on the proximity. In one embodiment, the at least one sensor comprises an image sensor.

In one embodiment, the portion of the first light transmitted through the transparent display unit is further adjustable based on a target contrast ratio of the transparent display apparatus. Additionally, the portion of the first light transmitted through the transparent display unit may be further adjustable based on a maximum luminance of the light emitting pixel elements.

In one embodiment, the portion of the first light transmitted through the transparent display unit is decreased as the brightness of the second light increases. In one embodiment, the portion of the first light transmitted through the transparent display unit is adjusted to a maximum amount when the brightness of the second light is equal to or less than a first reference brightness value, and the portion of the first light transmitted through the transparent display unit is adjusted to a minimum amount when the brightness of the second light is equal to or greater than a second reference brightness value.

In one embodiment, the transparent display apparatus supports at least a first mode, a second mode and a third mode of operation. In the first mode, the portion of the first light transmitted through the transparent display unit is maximized. In the second mode, the portion of the light transmitted through the transparent display unit is minimized. In the third mode, the portion of the first light transmitted through the transparent display unit is adjustable based on the signal indicative of the brightness of the second light.

In one embodiment, a maximum luminance of the light emissive pixel elements is adjustable based on the signal indicative of the brightness of the second light. For example, a gamma voltage to the transparent display unit may be adjustable to adjust the maximum luminance of the light emissive pixel elements.

In one embodiment, the portion of the first light transmitted through the transparent display unit is maintained constant when the brightness of the second light changes more than a predetermined number of times in a predetermined period.

In one embodiment, a method of operation in the transparent display apparatus is disclosed. The method comprises generating at least one signal indicative of brightness of the external light incident on the transparent display apparatus; and adjusting the portion of the external light transmitted through the transparent display unit based on the signal indicative of the brightness of the external light. In one embodiment, a non-transitory computer readable stores instructions that when executed by a processor cause the processor to perform the method.

BRIEF DESCRIPTION OF THE DRAWINGS

The above and other aspects, features and other advantages of the present invention will be more clearly understood from the following detailed description taken in conjunction with the accompanying drawings, in which:

FIGS. 2B and 2C are schematic diagrams illustrating light incident onto the transparent display apparatus according to the exemplary embodiment of the present invention;

FIG. 2D is a graph for describing a control of the light control unit of the transparent display apparatus according to the exemplary embodiment of the present invention;

FIG. 3 shows schematic diagrams illustrating a light control unit of the transparent display apparatus according to the exemplary embodiment of the present invention;

DETAILED DESCRIPTION OF THE PREFERRED EMBODIMENTS

Figure 1:
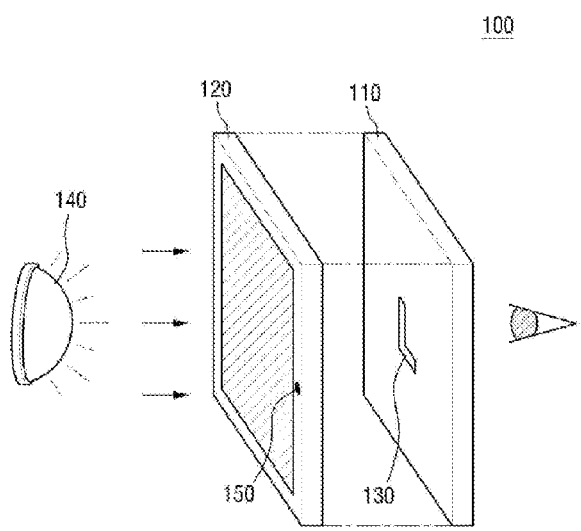
FIG. 1 is a schematic diagram of a transparent display apparatus according to an exemplary embodiment of the present invention.

Various advantages and features of the present invention and methods accomplishing thereof will become apparent from the following description of embodiments with reference to the accompanying drawings. However, the present invention is not limited to exemplary embodiment disclosed herein but will be implemented in various forms. The exemplary embodiments are provided by way of example only so that a person of ordinary skilled in the art can fully understand the disclosures of the present invention and the scope of the present invention. Therefore, the present invention will be defined only by the scope of the appended claims.

Indicating that elements or layers are "on" other elements or layers include both a case in which the corresponding elements are just above and directly contacting other elements and a case in which the corresponding elements are intervened with other layers or elements.

Although first, second, and the like are used in order to describe various components, the components are not limited by the terms. The above terms are used only to distinguish one component from the other component. Therefore, a first component mentioned below may be a second component within the technical spirit of the present invention.

In the drawings, size and thickness of each element are arbitrarily illustrated for convenience of description, and the present invention is not necessarily limited to those illustrated in the drawings.

Hereinafter, exemplary embodiments of the present invention will be described with reference to the accompanying drawings.

FIG. 1 is a schematic diagram of a transparent display apparatus according to an exemplary embodiment of the present invention. A transparent display apparatus 100 according to the exemplary embodiment of the present invention includes a transparent display unit 110, a light control unit 120, and an optical sensor 150.

The transparent display apparatus 100 in the present specification means a display apparatus in which at least a partial area of a screen of the display apparatus that is seen by a user is transparent. External light is transmitted through the transparent display apparatus 100, and the transparent display apparatus 100 self-emits light at the same time. The user of the transparent display apparatus 100 simultaneously receives information transmitted through the external light and information transmitted from the display apparatus itself. That is, informativeness in the transparent display apparatus 100 is divided into informativeness of a video displayed on the transparent display apparatus 100 and informativeness of a background on a back surface of the transparent display apparatus 100 through the external light.

Further, visibility of the transparent display apparatus 100 is divided into visibility of the video displayed on the transparent display apparatus 100 and visibility of the background on the back surface of the transparent display apparatus 100.

In terms of the visibility of the displayed video, the background on the back surface of the transparent display apparatus 100 is recognized as interference or noise for the displayed video. That is, in terms of the visibility of the displayed video, as the amount of light incident from the back surface is small, the visibility of the displayed video is improved. However, in order to improve the visibility of the displayed video, when the light incident from the back surface is completely blocked in the transparent display apparatus 100, since the informativeness of the background on the back surface of the transparent display apparatus 100 is also blocked, a major function of the transparent display apparatus 100 is lost.

The transparent display apparatus 100 according to the exemplary embodiment of the present invention is configured to maintain informativenss of the background on the back surface of the transparent display apparatus 100 while improving the visibility of the displayed video in the transparent display apparatus 100.

An ambient environment projected to the transparent display apparatus 100 has various brightness environments. Brightness means the amount of light in lux that is measured by an illuminated sensor. For example, the brightness in an office is about 200 to 500 lux, the brightness in the shade of a building or forest in the daytime is about 20,000 to 30,000 lux, and the brightness in the sun in the daytime is about 50,000 to 100,000 lux. Due to such a brightness environment, there are various variables that are involved in the brightness of light incident onto the transparent display apparatus 100.

The user's eye varies depending on the brightness environment. For example, the user' eye is capable of clearly seeing a video with low luminance under the low brightness environment of 200 lux, but is not capable of clearly seeing a video with low luminance under the brightness environment of 30,000 lux. The user' eye is capable of clearly seeing a video with a small amount of light or is not capable of clearly seeing the video with high-luminance light by dilating or contracting the pupil depending on the brightness environment.

The conventional display apparatus includes a configuration for suppressing a surface reflection of the display apparatus so as to correspond to the brightness environment, but such a configuration is designed in consideration of only light reflected from a front surface of the display apparatus. In the transparent display apparatus 100 according to the exemplary embodiment of the present invention, light incident on the back surface as well as the light reflected from the front surface is taken account of. Further, since the light incident on the back surface of the transparent display apparatus 100 is not noise but includes information that the user needs, the luminance of a video displayed by the transparent display apparatus and the light incident on the back surface need to be balanced under the various brightness conditions. That is, by appropriately maintaining a balance between the displayed video and intensity of the light incident on the back surface, it is possible to achieve optimum visibility of the displayed video and the background video.

The transparent display apparatus 100 according to the exemplary embodiment of the present invention measures characteristics of light incident from a light source 140 by using the optical sensor 150 and adjusts light transmittance of the light control unit 120 on the basis of the measured characteristics of light, so that it is possible to maximize the visibility of an object 130 displayed on the transparent display unit 110 and the informativeness of the background on the back surface of the transparent display apparatus 100.

The transparent display apparatus 100 according to the exemplary embodiment of the present invention may include various transparent display units 110.

The transparent display unit 110 of the transparent display apparatus 100 according to the exemplary embodiment of the present invention may be a transparent organic light-emitting display device. The transparent organic light-emitting display device includes an emissive area where display light is emitted and a transmissive area where incident light is transmitted through the organic light-emitting display device. The transparent organic light-emitting display device in the present specification means a display device in which a transparent organic light-emitting display device has a transmittance of at least 20% or more. Since the emissive area is adjacent to the transmissive area, when light incident on the transmissive area is excessively bright, the intensity of light in the transmissive area is relatively weak. Thus, the user of the transparent display apparatus is capable of seeing only light in the transmissive area. Accordingly, an ambient contrast ratio under an ambient light condition or gamma curve characteristics under the ambient light condition may be variably changed depending on brightness of the transmissive area. Accordingly, by adjusting the brightness of the transmissive area of the transparent organic light-emitting display device or the intensity of the light incident on the back surface of the transparent organic light-emitting display device, it is possible to control a contrast ratio.

The light control unit 120 is configured to change a path of light incident on the light control unit 120 by transmitting, scattering, absorbing or shielding the light, or change characteristics of the light. The light control unit 120 in the present specification may be used as a shielding unit, a light shielding unit, an active shielding film, an electric shutter unit, an active shading layer, or a light-transmitting unit.

The light control unit 120 can generate an area corresponding to an object so as to improve the visibility of the object by entirely or selectively controlling the brightness of the external light incident on the transparent display apparatus 100 so as to correspond to the transmissive area of the transparent display apparatus 100.

The controlling of the transmittance of the light incident on the transparent display apparatus 100 is closely relevant to how much of the incident light is absorbed or transmitted through the transparent display apparatus. When optical reflectivity of the light control unit 120 is high, the light from the back surface can be blocked. However, since the light control unit has high reflectivity, the light incident from the front surface is reflected, so that the visibility of the transparent display apparatus 100 is degraded. Accordingly, the light control unit 120 of the transparent display apparatus 100 according to the exemplary embodiment of the present invention may have a light transmittance of 1% to 90%, and the reflectivity of the light control unit 120 may be 10% or less. The light transmittance of the light control unit 120 may be represented as a plurality of gradation levels.

Furthermore, the light control unit 120 of the transparent display apparatus 100 according to the exemplary embodiment of the present invention may be a MEMS (Micro Electro Mechanical System) device. The MEMS device includes a substrate, thin-film layers, an air layer, and a reflection film layer. In the MEMS device, a screen is displayed according to two states of an open state and a collapsed state. In the MEMS device, when a voltage is not applied, the thin-film layers are separated, so that selective reflection can be carried out. When a low voltage is applied to generate an electrostatic force, the reflection film layer is moved to absorb light.

Moreover, the light control unit 120 of the transparent display apparatus 100 according to the exemplary embodiment of the present invention may be an electro wetting device or an electro chromic device. However, for the sake of convenience in description, a case where the light control unit 120 of the transparent display apparatus 100 is a light control unit 120 in which light transmittance is determined by charged particles will be described below.

The front surface and the back surface of the transparent display apparatus 100 in the present specification are defined in view of light emitted from the transparent display apparatus 100. In the present specification, the front surface of the transparent display apparatus 100 means a surface on which light is emitted from the transparent display apparatus 100, and the back surface of the transparent display apparatus 100 means a surface opposite to the surface on which light is emitted from the transparent display apparatus 100. The transparent display apparatus 100 includes the transparent display unit 110 and the light control unit 120, and the light control unit 120 may be disposed on the front surface or the back surface of the transparent display unit 110 and overlap with the transparent display unit 110. The light control unit 120 is preferably disposed on the back surface of the transparent display unit 110 to control the light from the back surface.

Referring to FIG. 1, for sake of convenience in description, although the transparent display unit 110 and the light control unit 120 are distanced from each other, the transparent display unit 110 and the light control unit 120 may be bonded by an adhesive or glue or may be positioned sufficiently close to each other so as to be driven as at least one transparent display apparatus 100.

Since the light control unit 120 and the transparent display unit 110 have the same resolution, an area displayed by the transparent display unit 110 and an area controlled by the light control unit 120 are substantially the same. Alternatively, the transparent display unit 110 and the light control unit 120 may have different resolutions. For example, the resolution of the light control unit 120 may be lower than the resolution of the transparent display unit 110. In such a case, a driving algorithm for allowing the resolution of the transparent display unit 110 to be compatible with the resolution of the light control unit 120 may be further provided. Otherwise, the light control unit 120 may be controlled as a whole. In other words, the entire area of the light control unit 120 may be controlled as one pixel.

The optical sensor 150 of the transparent display apparatus 100 according to the exemplary embodiment of the present invention is a device that detects the characteristics of the incident light and converts the detected characteristics of the light into an electric signal indicative of the detected characteristics of the light. The optical sensor 150 may be a photoconductive effect optical sensor or a photovoltaic effect optical sensor. The photoconductive effect optical sensor includes a CdS (Cadmium Sulfide) photoconductive cell and a PbS (Lead sulfide) photoconductive cell, and the photovoltaic effect optical sensor may include a photo diode, a photo transistor and a LASCR (Light Activated SCR). The optical sensor 150 may include a light emitting part and a light receiving part.

The optical sensor 150 of the transparent display apparatus 100 according to the exemplary embodiment of the present invention may be classified according to functions. That is, the optical sensor 150 includes an illuminated sensor for measuring the brightness of the light, a color temperature sensor for measuring a color temperature, a distance measurement sensor for measuring a distance, and a photo interrupter that detects an object.

Referring to FIG. 1, in the transparent display apparatus 100 according to the exemplary embodiment of the present invention, the optical sensor 150 is disposed on one surface of the light control unit 120. An object 130 is displayed on the transparent display unit 110, and a viewer positions on the front surface of the transparent display unit 110. In FIG. 1, the light source 140 is positioned on the back surface of the light control unit 120, and incident external light is explained using arrows in the following description.

The light source 140 means all kinds of light sources in which light is allowed to be incident onto the transparent display apparatus 100 according to the exemplary embodiment of the present invention by emitting or reflecting the light. The light source 140 may be the sun, and may include all kinds of lightings that emit light. In addition, the light source 140 may include all objects that reflect light. The light source 140 is not limited, but may include all of the light sources 140 of light incident onto the transparent display apparatus 100. Further, the light source 140 may emit light having any wavelength. Hereinafter, a case where light having a visible area is emitted will be explained below.

The transparent display unit 110 of the transparent display apparatus 100 according to the exemplary embodiment of the present invention displays the object 130, and the optical sensor 150 measures the characteristics of the light incident from the light source 140 and adjusts the light transmittance of the light control unit 120 on the basis of the measured characteristics of the light. By adjusting the light transmittance of the light control unit 120, the portion of the external light passing through the transparent display unit 110 is adjusted. The transparent display apparatus 100 allows the light control unit 120 to be transparent or not to be transparent in order to realize the adjusted light transmittance. FIG. 1 illustrates the light control unit 120 that controls the light to become the adjusted light transmittance. In the transparent display apparatus 100 according to the exemplary embodiment of the present invention, the characteristics of the light incident onto the transparent display apparatus 100 is measured by the sensor, and the transparent display unit 110 or the light control unit 120 is adjusted based on the measured characteristics of the light. Thus, the transparent display apparatus 100 having improved visibility while being less affected by an external environment is realized.

The visibility in the transparent display apparatus 100 may be measured using, for example, a contrast ratio of a video. In addition to the contrast ratio, a determination criterion of the visibility in the transparent display apparatus 100 may be different depending on various conditions such as luminance, color sensitivity, and resolution, or may be different depending on users. Hereinafter, a case where the determination criterion is the contrast ratio will be described below. However, the transparent display apparatus according to the exemplary embodiment of the present invention is not interpreted as being limited to the contrast ratio, but the improvement of the visibility may be represented according to different determination criteria.

The contrast ratio means a ratio of maximum luminance to minimum luminance in the transparent display apparatus. The maximum luminance is typically luminance measured when a full-white video is input. As the contrast ratio is high, a more excellent quality can be typically realized. The contrast ratio is divided into a dynamic contrast ratio, a static contrast ratio, a darkroom contrast ratio and an ambient contrast ratio. Hereinafter, it is interpreted that the contrast ratio means the static and ambient contrast ratios, but the dynamic and darkroom contrast ratios may be used as the contrast ratios in the transparent display apparatus according to the exemplary embodiment of the present invention.

The contrast ratio in the transparent display apparatus 100 is affected by the brightness environment. The light incident on the front surface of the transparent display apparatus 100 decreases the contrast ratio of the transparent display apparatus 100 by being reflected from the transparent display apparatus 100 and then being seen by the user, so that contrast is decreased. The light incident on the back surface of the transparent display apparatus 100 decreases the contrast ratio of the transparent display apparatus 100 by being seen by the user through the transmissive area of the transparent display apparatus 100.

The light incident on the front surface of the transparent display apparatus 100 is reflected by at least 1% to 5%, and the light incident on the back surface of the transparent display apparatus 100 is transmitted by, for example, 20% when taking account of only the self light transmittance of the transparent display apparatus 100. That is, the contrast ratio in the transparent display apparatus 100 depends on the ambient brightness environment, and, specifically, depends on the light incident on the back surface.

TABLE 1

| | Brightness environment | | | | | |
| --- | --- | --- | --- | --- | --- | --- |
| | 200 lux | | | 2000 lux | | |
| | White (nit) | Black (nit) | Contrast ratio | White (nit) | Black (nit) | Contrast ratio |
| Incident on front surface | 203 | 3 | 66.66:1 | 230 | 30 | 7.6:1 |
| Incident on back surface | 240 | 40 | 6:1 | 600 | 400 | 1.5:1 |

Table 1 shows white/black luminance and a contrast ratio of a display apparatus in which 1.5% of light incident on a front surface is reflected under the brightness environments of 200 lux and 2000 lux and the transparent display apparatus 100 in which 20% of light incident on a back surface is transmitted.

Referring to Table 1, the contrast ratio in the transparent display apparatus 100 is affected by both light incident on the front surface and light incident on the back surface. However, when taking account of only the brightness environment of 200 lux, a decrease in the contrast ratio caused by the light incident on the back surface is more noticeable than that the decrease in the contrast ratio caused by the reflection of the light incident on the front surface. Accordingly, the transparent display apparatus 100 controls the amount of the light incident on the back surface so as to improve the contrast ratio.

Hereinafter, a specific configuration of a transparent display apparatus according to an exemplary embodiment of the present invention will be described.

Figure 2A:
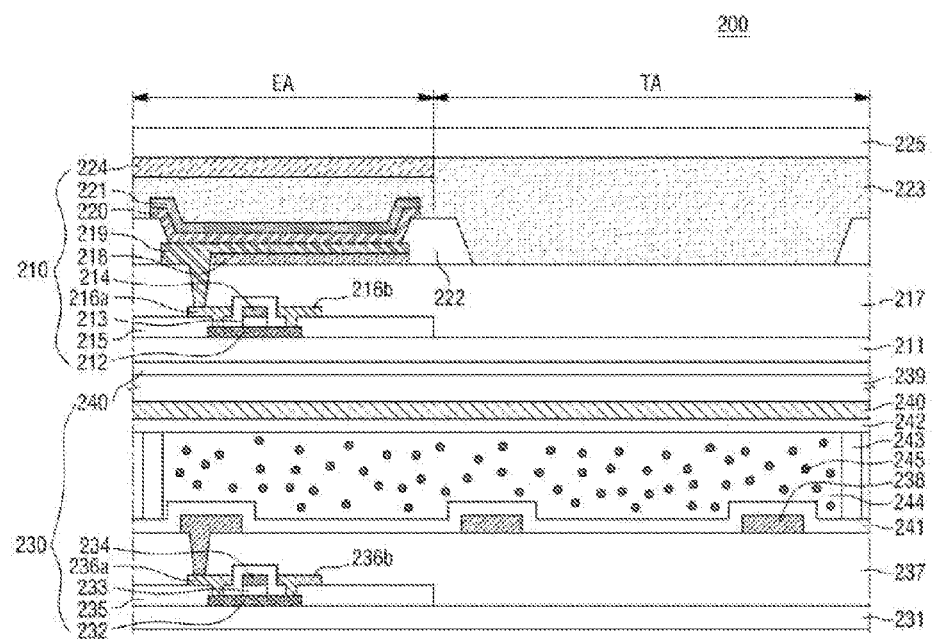
FIG. 2A is a schematic cross-sectional view of the transparent display apparatus according to an exemplary embodiment of the present invention.

FIG. 2A is a schematic cross-sectional view of the transparent display apparatus according to an exemplary embodiment of the present invention. FIG. 2A illustrates a transparent display unit 210 and a light control unit 230. The transparent display unit 210 may be a transparent organic light-emitting display device in which a video is displayed, and the light control unit 230 may be a charged-particle control device in which light transmittance is controlled.

The transparent display unit 210 includes an emissive area EA and a transmissive area TA. The emissive area EA is also referred to as an emissive part, and the transmissive area TA is also referred to as a transmissive part. The emissive area EA is an area where an actual image is realized, and the transmissive area TA is an area where at least a portion of external light from a back surface of a transparent display apparatus 200 is transmitted. Accordingly, when the transparent organic light-emitting display device is not driven, the user is capable of seeing a background through the transmissive area TA, namely, an object of a back surface of the transparent display apparatus 200. Meanwhile, when the transparent display apparatus 200 is driven, the user is capable of simultaneously seeing a video of the emissive area EA and the background through the transmissive area TA. Although it has been illustrated in FIG. 2A that an area of the transmissive area TA of a sub-pixel region is greater than that of the emissive area EA, an area ratio of the emissive area EA to the transmissive area TA in the sub-pixel region may be variously set in terms of visibility and transmittance.

Hereinafter, a specific configuration of the transparent display apparatus 200 will be described. A configuration of the transparent display unit 210 is first described, and a configuration of the light control unit 230 is described.

Referring to FIG. 2A, the transparent display unit 210 includes a first substrate 211, an active layer 212, a gate insulating film 213, a gate electrode 214, an interlayer insulating film 215, a source electrode 216b, a drain electrode 216a, an overcoat layer 217, a reflective layer 218, an anode 219, an organic light-emitting layer 220, a cathode 221, and a bank layer 222. The active layer 212, the gate insulating film 213, the gate electrode 214, the interlayer insulating film 215, the source electrode 216b and the drain electrode 216a constitute a thin-film transistor, and the anode 219, the organic light-emitting layer 220 and the cathode 221 constitute an organic light-emitting diode. The organic light-emitting diode includes a sealing part 223, a color filter 224, and a second substrate 225. FIG. 2A illustrates a case where the transparent display unit 210 is a top-emission type organic light-emitting display device.

The specific configuration of the light control unit 230 is described below.

Referring to FIG. 2A, the light control unit 230 includes a third substrate 231, an active layer 232, a gate insulating film 233, a gate electrode 234, an interlayer insulating film 235, a source electrode 236b, a drain electrode 236a, an overcoat layer 237, first electrodes 238, a second electrode 240, protection layers 241 and 242, a fluid 244 including charged particles 245, and partition walls 243.

The light control unit 230 is attached to the transparent display unit 210. Referring to FIG. 2A, the transparent organic light-emitting display device is disposed on the light control unit 230 by using a transparent adhesive or a transparent adhesive layer. In FIG. 2A, although it has been illustrated that the light control unit 230 is disposed under the transparent display unit 210, the light control unit 230 may be formed on the transparent display unit 210. The light control unit 230 and the transparent display unit 210 of the transparent display apparatus 200 may be independently driven, and may selectively control incident light.

Figure 2B:
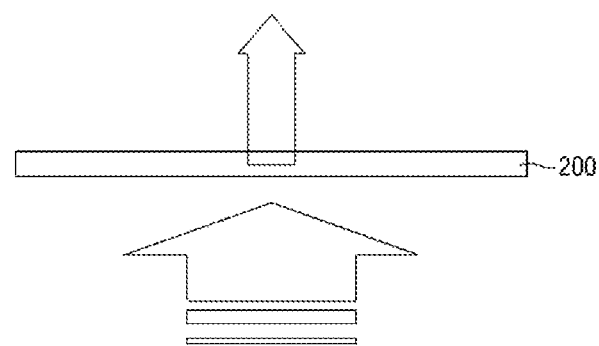

FIG. 2B is a schematic diagram illustrating light incident onto the transparent display apparatus according to the exemplary embodiment of the present invention. FIG. 2B illustrates light incident on one light receiving point of the back surface of the transparent display apparatus 200. Although not specifically mentioned, the "light incident or incident light" in the present specification means light incident on one surface of the transparent display apparatus 200. The light incident on the one surface of the transparent display apparatus 200 can be measured by the illuminated sensor included in the area of the transparent display apparatus 200 where light is not emitted or any sensor disposed to measure the incident light.

Referring to FIG. 2B, the light incident on the one surface of the transparent display apparatus 200 may include all kinds of light incident at an angle of 0° to 180° with respect to the substrate as well as light vertically incident onto the transparent display apparatus 200. However, for the sake of convenience in description, although incident light which has quadrature components by being incident onto the transparent display apparatus 200 at a right angle or by being refracted in the transparent display apparatus 200 is described, incident light not having the quadrature components may be described similarly to the incident light that enters at a right angle.

FIG. 2C illustrates the light incident onto the transparent display apparatus 200 according to the exemplary embodiment of the present invention according to the light controlling of light control units 230a, 230b, and 230c. Furthermore, the transparent display apparatus 200 include the light control units 230a, 230b and 230c, and the light control units 230a, 230b and 230c have different light transmittance values depending on the applying duration of a voltage or intensity of the voltage.

The transparent display apparatus 200 selectively shields incident light of the transparent display apparatus 200 by controlling the light control units 230a, 230b and 230c to adjust the contrast ratio of the transparent display apparatus 200.

The contrast ratio may be defined a value obtained by dividing maximum luminance of a video by minimum luminance. The contrast ratio of the transparent display apparatus 200 in the present specification is calculated so as to include luminance of light, which has entered the back surface of the transparent display apparatus 200 and has been transmitted except for surface-reflection luminance of the transparent display unit from the external light. Accordingly, the contrast ratio in the transparent display apparatus 200 is a value obtained by dividing (maximum luminance of video+luminance of transmitted back-surface light) by (minimum luminance of video+luminance of transmitted back-surface light).

$$\text{contrast ratio} = X : 1 = \frac{L_{max} + L_{back} \times T_{self} \times T_{var}}{L_{min} + L_{back} \times T_{self} \times T_{var}} : 1$$

wherein Lmax is maximum luminance, Lmin is minimum luminance, Lback is brightness of back-surface light of the transparent display apparatus, Tself is self light transmittance of the transparent display apparatus and is generally a fixed value attributed to the elements on the transparent display apparatus that may block light (OLED, metal lines, imperfections in materials, etc), and Tvar is the light transmittance of light control units 230a, 230b and 230c of the transparent display apparatus.

The maximum luminance means the highest luminance capable of being represented by the transparent display apparatus, and is assumed as, for example, 400 nit. The minimum luminance is the lowest luminance capable of being represented by the transparent display apparatus 200 and is assumed as 0.01 nit, for example.

The "transmitted back-surface light" means light, which has entered the back surface of the transparent display apparatus 200 and has passed through the transparent display apparatus 200, and the luminance of the transmitted back-surface light is luminance to which the self light transmittance of the transparent display apparatus 200 is applied. That is, the luminance of the transmitted back-surface light is luminance to which the Tself and the Tvar are applied to the Lback in combination.

It is assumed that the brightness of the light incident on the back surface is 200 lux and the self light transmittance is 0.4 (40%), but the self light transmittance may vary depending on the configuration of the transparent display apparatus 200.

Since the transparent display apparatus 200 including the light control units 230a, 230b and 230c can control the luminance of the light incident on the back surface that passes through the transparent display unit 210, the transmittance of the light control unit acts on the luminance of the incident light on the back surface as variables. Here, the light transmittance is light transmittance controlled by the light control units 230a, 230b and 230c of the transparent display apparatus 200 and is represented as a normalized value of 0 to 1.

In (a), (b), and (c) of FIG. 2C, it is assumed that light rays having the same intensities are emitted in the emissive part and light rays incident onto the transparent display apparatus 200 are constant. In (a) of FIG. 2C, the light control unit 230a is controlled to allow all the incident light rays to be transmitted. When the light control unit 230a is controlled to allow all the incident light rays to be transmitted, the user sees both light emitted from the emissive part and light incident from the back surface of the transparent display apparatus 200.

At this time, when assuming that the transmittance of the light control unit 230a is 100%, a contrast ratio can be calculated by using the aforementioned contrast-ratio equation. The transmittance of 100% is an ideal value, and the transmittance of 100% in the present invention means substantial maximum transmittance capable of being realized by the light control unit. In one embodiment, an ambient contrast ratio of the transparent display apparatus is at least 6:1 when the brightness of the external light measured by said one or more optical sensors is 500 lux or less.

$$\text{contrast ratio} = 6 : 1 = \frac{400 + 200 \times 0.4 \times 1.0}{0.01 + 200 \times 0.4 \times 1.0} : 1 \qquad (a)$$

In (b) of FIG. 2C, the light control unit 230b is controlled to allow a part of incident light to be transmitted. When the light control unit 230b is controlled to allow a part of incident light to be transmitted, since the user is capable of more clearly seeing emitted light as compared to (a) of FIG. 2C, the visibility of the transparent display apparatus is relatively improved.

It is assumed that the transmittance of the light control unit 230b is 50% with reference to values in (a) of FIG. 2C, and the contrast ratio is calculated.

$$\text{contrast ratio} = 11 : 1 = \frac{400 + 200 \times 0.4 \times 0.5}{0.01 + 200 \times 0.4 \times 0.5} : 1 \qquad (b)$$

In (c) of FIG. 2C, the light control unit 230c is controlled to further decrease the transmittance of the incident light. When the light control unit 230c is controlled to further shield the incident light, since the user is capable of more clearly seeing emitted light as compared to (a) and (b) of FIG. 2C, the visibility of the transparent display apparatus is improved, but it may be difficult to see the object on the back surface of the transparent display apparatus 200.

It is assumed that the transmittance of the light control unit 230c is 10% with reference to values in (a) of FIG. 2C, and the contrast ratio is calculated.

$$\text{contrast ratio} = 51 : 1 = \frac{400 + 200 \times 0.4 \times 0.1}{0.01 + 200 \times 0.4 \times 0.1} : 1 \qquad (c)$$

Referring to (a), (b) and (c) of FIG. 2C and the contrast ratios, it can be seen that the contrast ratios in the transparent display apparatus 200 depends on the maximum luminance of the transparent display apparatus 200, the self transmittance of the transparent display apparatus 200, and the transmittance of the light control units 230a, 230b and 230c, and the minimum luminance does not affect a variation in the contrast ratio due to a luminance difference with the incident light.

The transparent display apparatus 200 according to the exemplary embodiment of the present invention achieves a required contrast ratio by using the aforementioned contrast-ratio equations. The transparent display apparatus 200 is configured to achieve a target contrast ratio that is set by the user or is determined by the transparent display apparatus 200.

The target contrast ratio may be a minimum contrast ratio that is required to see the video in the transparent display apparatus 200. Alternatively, the target contrast ratio may be a contrast ratio for allowing informativeness of the background on the back surface and informativeness of the video to be optimally balanced.

After the transparent display apparatus 200 is set the target contrast ratio, the transparent display apparatus 200 achieves the target contrast ratio by adjusting controllable variables in the aforementioned equations. The Lmin, Lmax, and Tself are generally considered as prospective characteristics of a display. The incident light is resulted from the self light transmittance of the transparent display unit 210, and the Tself is resulted from characteristics of the transparent display unit 210. The transparent display apparatus 200 continuously measures Lback, which is the amount of light incident on the back surface through the optical sensor such as the illuminated sensor. At the same time, as stated above, the transparent display apparatus 200 achieves the target contrast ratio by controlling the Tvar, which is the transmittance of the light control units 230a, 230b, and 230c. For example, when the target contrast ratio of the transparent display apparatus 200 is 6:1, the transparent display apparatus 200 continuously updates the Lback from the optical sensor and continuously adjusts the Tvar on the basis of the updated Lback, so that the contrast ratio of the transparent display apparatus 200 is maintained to be approximate to the target contrast ratio.

In addition, in various exemplary embodiments, by adjusting a gamma voltage of the transparent display apparatus 200, it is possible to adjust the Lmax as the maximum luminance. The maximum luminance is determined by a gamma voltage generating unit included in the display apparatus. The gamma voltage generating unit converts a digital input video into an analog voltage and applies the converted voltage to the organic light-emitting layer 220 of the emissive area EA. The gamma voltage generating unit generates a gamma voltage corresponding to the input video by using a plurality of registers. The maximum luminance can be adjusted by controlling a maximum value of the gamma voltage corresponding to the input video. The transparent display apparatus 200 increases the gamma voltage to increase or decrease the luminance of the transparent display unit 210, so that the transparent display apparatus can achieve the target contrast ratio.

In the transparent display apparatus 200 according to the exemplary embodiment of the present invention, by controlling the transmittance of the light control units 230a, 230b and 230c, it is possible to greatly improve the contrast ratio, and it is possible to control the transparent display apparatus 200 so as to enhance the visibility from the point of view of the user of the transparent display apparatus 200.

FIG. 2D is a graph for describing a control of the light control unit of the transparent display apparatus according to the exemplary embodiment of the present invention. An X-axis in the graph represents brightness (Lux) of light incident on the back surface, and shielding rate represents a degree of shading light by the light control unit. The shielding rate is in inverse proportion to the transmittance. That is, as the transmittance is increased, the shielding rate is decreased, and as the shielding rate is increased, the transmittance is decreased. When the target contrast ratio is set to 2:1, line X in the graph represents the shielding rate of the light control unit required depending on the brightness. The shielding rate is calculated using the following equation.

$$T_{var} = \frac{\left(\frac{L_{max}}{CR} - L_{min}\right)}{L_{back} \times T_{self}\left(1 - \frac{1}{CR}\right)} \approx \frac{\left(\frac{L_{max}}{CR}\right)}{L_{back} \times T_{self}\left(1 - \frac{1}{CR}\right)}$$

Here, the transmittance Tvar of the light control unit is obtained by subtracting the shielding rate from 1. Lmax, Lmin, Lback and Tself are the same values as those in FIG. 2C. CR represents a target contrast ratio. The equation of Tvar is obtained by arranging the contrast-ratio equation in FIG. 2C for the Tvar. Since the Lmin is a small value, the Lmin may be omitted for the sake of convenience in calculation. (a) of FIG. 2D is a graph that represents a relation between the Lback and the Tvar when the CR is set to 2, the Tself is set to 0.2, and the Lmax is set to 400.

Reference brightness values for determining a zone A, a zone B and a zone C is derived from the preceding equation. For example, the reference brightness values of the zone A and the zone B correspond to brightness values when the shielding rate is changed from 0 to a value of 0 or more, and the reference brightness values of the zone B and the zone C correspond to brightness values when the shielding rate is changed to a value of 0.9 or more.

Line X means shielding rate according to the Tvar equation. Hereinafter, the description is focused on line X. The reference brightness values of the zone A and the zone B are 1200 lux, and in the zone A where the brightness is in a range of 0 to 1200 lux, even when the shielding rate of the light control unit is 0, it is possible to maintain CR of 2 or more. That is, in zone A, even though the light control unit is operated in a transparent state, since the required contrast ratio is achieved, the light control unit is operated in the transparent state to maximize the amount of light passing through the display apparatus. In one embodiment, the reference brightness value between zone A and zone B is between 300 to 1500 lux.

Meanwhile, the reference illumination values of the zone B and the zone C are 8400 lux, and in the zone B where the brightness is in a range of 1200 Lux to 8400 Lux, the shielding rate of the light control unit is varied depending on the brightness, so that it is possible to maintain CR of 2 or more. When the brightness of the light incident on the back surface corresponds to the zone B, the light control unit is operated in a translucent state. In one embodiment, the reference brightness value between zone B and zone C is between 6000 to 15000 lux.

In the zone C where the brightness is 8400 Lux or more, the shielding rate of the light control unit is 0.9 or more. When the shielding rate is 0.9 or 90% or more, it is determined that an effect of the translucent state is marginal, and the light control unit is substantially in a shield state. Thus, in the zone C, the light control unit is preferably operated in the shield state. That is, when the shielding rate is 90% or more, the informativeness of the back surface of the light control unit is degraded, and the contrast ratio is also decreased. In order to minimize such a phenomenon, when the shielding rate is 90% or more, the light control unit is realized to be operated in a state in which the shielding rate is 100% to minimize the amount of light passing through the display apparatus. The shield state of 90% or more is a value exhibiting a substantial shield effect verified through an experiment result, and the shield state may be naturally set to a higher value.

When the light control unit is operated in the translucent state in the zone B, the shielding rate of the light control unit can be continuously varied as shown in line X. The light control unit can vary the shielding rate by adjusting magnitude or width of a voltage applied depending on the shielding rate.

Line Y is a look-up table value that is set by a result through repetition experiments. The shielding rate of the light control unit can be varied in plurality of steps depending on the brightness of the light measured by the optical sensor such that the light control unit has a constant shielding rate for a constant zone such as line Y. Although line Y simplifies the shielding rate depending on the brightness as compared to that in line X, the realization is simple and similar shield effect can be exhibited.

Meanwhile, as the set target contrast ratio is varied, a range of brightness values to which the transparent state, the translucent state, and the shield state are applied is varied. For example, when the target contrast ratio is increased, the maximum brightness to which the transparent state is applied is decreased, and the minimum brightness to which the shield state is applied is also decreased. Accordingly, in order to realize one or more target contrast ratios, the look-up table is preferably implemented as a look-up table that stores information on a plurality of target contrast ratios.

(b) of FIG. 2D is a graph showing a relation between Lback and Tvar when the target contrast ratio is 7:1. When compared to (a) of FIG. 2D, (b) of FIG. 2D illustrates that brightness at the shielding rate of 0 and brightness at the shielding rate of approximately 1.0 are relatively lower than those in the target contrast ratio of 2:1. Eventually, a state reference of the light control unit as well as the shielding rate of the light control unit is varied depending on the target contrast ratio.

FIG. 3 shows schematic diagrams illustrating a light control unit of the transparent display apparatus according to the exemplary embodiment of the present invention. In (a) and (b) of FIG. 3, a third substrate 310, a fourth substrate 320, a first electrode 330, a second electrode 340, partition walls 360, a protection layer 350 and a fluid 380 are the same as the third substrate 231, the fourth substrate 239, the first electrode 238, the second electrode 240, the partition walls 243, the protection layers 241 and 242 and the fluid 244 described in FIG. 2A. Thus, the redundant descriptions thereof are not presented.

In (a) of FIG. 3, light incident onto a light control unit 300 passes through the third substrate 310, reaches black charged particles 370, and is then absorbed by the black charged particles 370. Since the incident light is shielded by an arrangement of the black charged particles 370, such a state of the transparent display apparatus is called a shield state.

In (b) of FIG. 3, light incident on the light control unit 300 sequentially passes through the third substrate 310, the second electrode 340, and the fourth substrate 320. The black charged particles 375 are arranged in a manner that does not block the light. Such a state of the light control unit 300 is called a transmissive state or a transparent state.

Alternatively, only a part of the incident light is transmitted between the black charged particles. Since the transmitted part of the light is transmitted through the transmissive area, the object on the back surface of the transparent display apparatus can be seen at an upper part of the transparent display apparatus. The remaining part of the incident light reaches the black charged particles and is absorbed by the black charged particles. Since the incident light is transmitted or shielded by the spread of the black charged particles 370 and 375, such a state of the light control unit 300 is called a translucent state.

In the translucent state in which only a part of the incident light is transmitted, the transmittance is variably controlled depending on an applying time or applying magnitude of a voltage applied to the first electrode 330 or the second electrode 340 of the light control unit 300.

Figure 4:
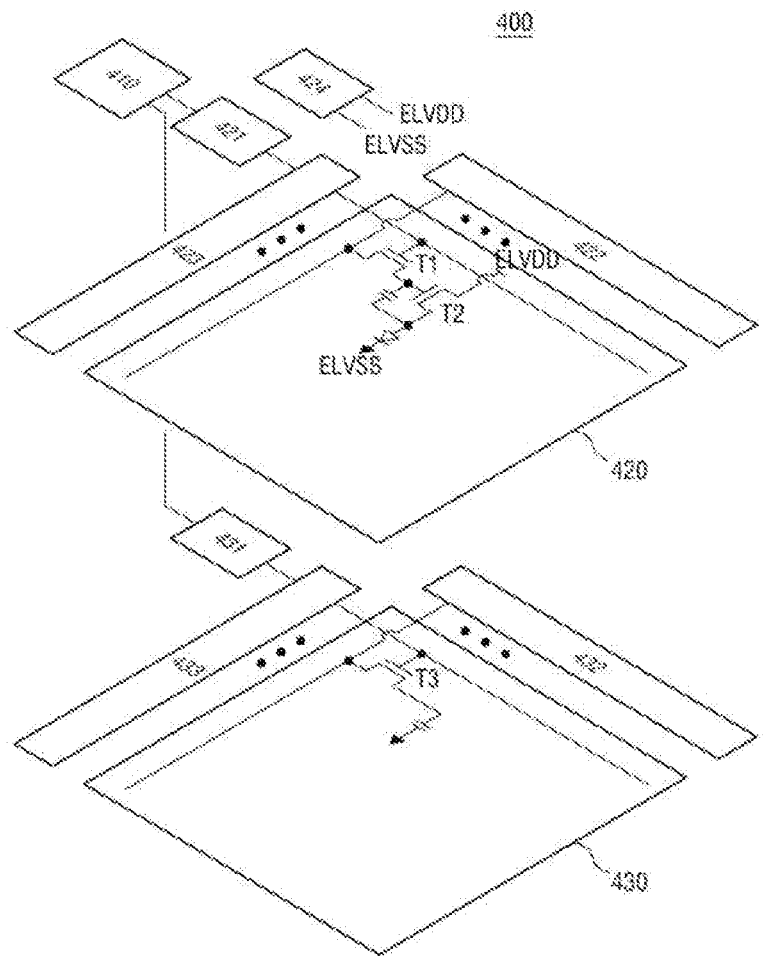
FIG. 4 is a schematic diagram of a transparent display apparatus according to an exemplary embodiment of the present invention.

FIG. 4 is a schematic diagram of a transparent display apparatus according to an exemplary embodiment of the present invention. A transparent display apparatus 400 includes a processing unit 410, a transparent-display-unit timing controller 421, a transparent-display-unit panel 420, a transparent-display-unit data driving unit 422, a transparent-display-unit scan driving unit 423, a light-control-unit timing controller 431, a light-control-unit panel 430, a light-control-unit data driving unit 432, and a light-control-unit scan driving unit 433.

The timing controllers 421 and 431 may be formed on one integrated circuit or may be patterned on the panels, and the timing controllers 421 and 431 and the data driving units 422 and 432 may be provided in various forms such as COG (Chip on Glass), COF (Chip on Film), PCB, and FPCB (Flexible Circuit Board).

The processing unit 410 provides video data to the transparent-display-unit timing controller 421 and light control data to the light-control-unit timing controller 431. The light control data may be data for selectively shielding incident light, and may be provided together with a data signal to the light-control-unit timing controller 431 or may be separately provided to the light-control-unit timing controller.

The processing unit 410 may generate a synchronization signal and provide the generated synchronization signal to the transparent-display-unit timing controller 421 and the light-control-unit timing controller 431 so as to allow the transparent display unit and the light control unit to be time-synchronized. The synchronization signal may be generated to be synchronized to a panel having a slow response speed of the transparent display unit and the light control unit.

The transparent display unit includes the transparent-display-unit timing controller 421, the transparent-display-unit panel 420, the transparent-display-unit data driving unit 422, the transparent-display-unit scan driving unit 423, and a power supply unit 424.

The transparent-display-unit timing controller 421 may be referred to as a transparent-display-unit driving unit, and the transparent-display-unit driving unit generates a scan control signal on the basis of the video to control the transparent-display-unit scan driving unit 423, and generates a data signal to control the transparent-display-unit data driving unit 422.

The transparent-display-unit data driving unit 422 receives the data signal from the transparent-display-unit timing controller 421. The transparent-display-unit data driving unit 422 converts the data signal into the corresponding gamma voltage, and determines the amount of current flowing in the anode and the cathode of the organic light-emitting diode to control a degree of emitting of the corresponding pixel. When the gamma voltage is adjusted, since the maximum luminance of the transparent display apparatus 400 is varied, the contrast ratio of the transparent display apparatus 400 is varied. The transparent display apparatus 400 can adjust the gamma voltage to achieve a target contrast ratio, and can continuously the gamma voltage to maintain the target contrast ratio.

The transparent-display-unit scan driving unit 423 is operated such that scan lines are driven and the data signal is input to sub-pixels corresponding to the scan lines. The transparent-display-unit scan driving unit 423 may provide one scan line signal or a plurality of scan line signals for selecting the scan line or a plurality of scan lines to the transparent-display-unit panel 420.

The power supply unit 424 supplies various voltages required in the transparent-display-unit data driving unit 422, the transparent-display-unit scan driving unit 423 and the anode and the cathode of the transparent-display-unit panel 420. The power supply unit 424 supplies ELVDD, ELVSS, VDD, and VSS. The transparent-display-unit panel 420 includes a plurality of scan lines, a plurality of data lines, and a plurality of transparent-display-unit sub-pixels.

In order to emit the organic light-emitting layer by video information of the input data signal, a switching thin-film transistor T1 and a driving thin-film transistor T2 are used.

Driving of the light control unit in the transparent display apparatus 400 according to the exemplary embodiment of the present invention is described. The light control unit may be configured and be driven in a passive matrix. The light control unit may be turned on/off as a whole or may be controlled for each line. Alternatively, the light control unit may be driven in an active matrix. The light-control-unit timing controller 431 receives the light control data from the processing unit 410 as mentioned above. The light control data is data for controlling the light transmittance so as to achieve the target contrast ratio of the transparent display apparatus 400. The light control data is determined by the light-control-unit timing controller 431 or the processing unit 410 of the transparent display apparatus 400.

The light-control-unit scan driving unit 433 is operated such that the scan lines are driven and the data signal is input to the pixels corresponding to the scan lines. The light-control-unit data driving unit 432 converts the data signal into the corresponding voltage, and supplies the voltage and pulse to the light control unit to control the spread of the black charged particles. In other words, the transparent display apparatus 400 adjusts the voltage or pulse applied to the light control unit by using the light control data, so that the light transmittance of the light control unit can be adjusted. As a result, it is possible to achieve the target contrast ratio.

The power supply unit supplies the voltages required in the light-control-unit data driving unit 432 and the light-control-unit scan driving unit 433.

When the scan control signal is applied from a scan wiring, a switching thin-film transistor T3 transmits the light control data signal from the data line to the electrode of the light control unit to control the voltage applied to the electrode, and the movement of the black charged particles distributed in the fluid is controlled by the applied voltage.

Figure 5:
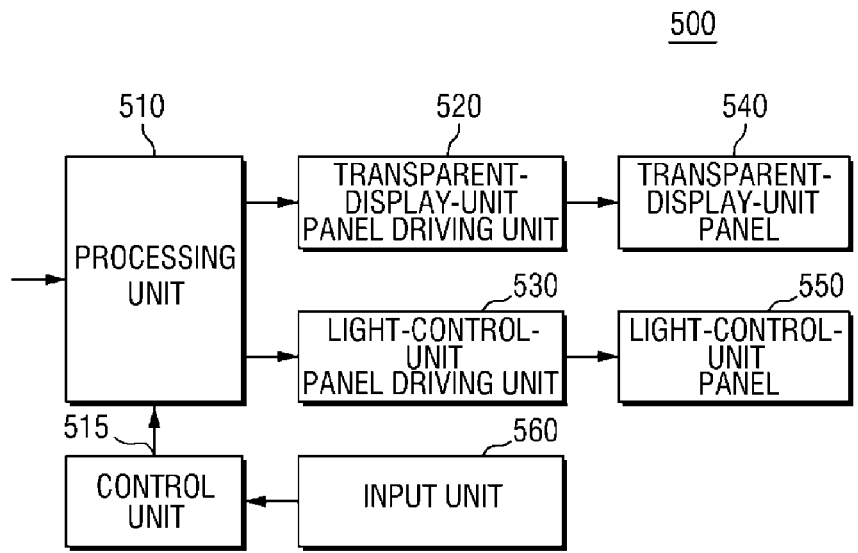
FIG. 5 is a block diagram of a transparent display apparatus according to an exemplary embodiment of the present invention.

FIG. 5 is a block diagram of a transparent display apparatus according to an exemplary embodiment of the present invention. A transparent display apparatus 500 includes a processing unit 510, a control unit 515, a transparent display unit, and a light control unit. The transparent display unit includes a transparent-display-unit panel 540 and a transparent-display-unit panel driving unit 520, and the light control unit includes a light-control-unit panel 550 and a light-control-unit panel driving unit 530. The transparent-display-unit panel 540 and the light-control-unit panel 550 include a plurality of pixels and sub-pixels.

The control unit 515 controls an operation of a system of the transparent display apparatus 500. The control unit 515 may operate the system in response to a command of the user, and operates the system according to a preset operation. The control unit 515 controls, for example, the processing unit 510 to decrease the light transmittance on the basis of the light characteristics from the optical sensor so as to improve the visibility of the video displayed on the transparent display apparatus 500 and to operate various modes of the transparent display apparatus 500.

The control unit 515 of the transparent display apparatus 500 includes the system. The system includes an OS (Operating System). The OS further includes various modes for providing effects of the present invention to the user. The modes are selected by the user when necessary, and, especially, a third mode is actively adapted to the ambient environment to be selected as an optimum mode.

A first mode sets the light control unit to a transmissive state. The first mode maximizes a transparent effect and thereby maximizes the light being transmitted. However, a problem about the visibility of an external environment is not solved.

A second mode set the light control unit to a shield state. The second mode maximizes a shield effect and thereby minimizes the light being transmitted. The visibility is enhanced as much as possible in the second mode. However, there is a problem that since the transmissive area of the entire screen is shielded, a transparent display effect is not exhibited.

The third mode is a mode for adjusting the light transmittance of the transparent display apparatus 500 on the basis of the light characteristics from the optical sensor. The transparent display apparatus 500 in the third mode minimizes a decrease in visibility with a change in an external brightness environment and the external environment. In the third mode, the visibility of the input video is maintained while maintaining the transparent effect.

A fourth mode is a light control mode, and the fourth mode displays the video by the resolution of the light control unit. By blocking the power supply of the organic light-emitting device, the organic light-emitting device is driven at low power. The fourth mode is specialized under the outdoor environment and is effective when the external light is considerably bright. In the fourth mode, the video is realized by the shielding. The fourth mode may be selected by the user in the environment of very high brightness or may be operated by setting a fourth mode entering reference brightness.

The operations of the control unit 515 are selected through an input unit 560 on the system. For example, the transparent display apparatus 500 includes the input unit 560, and the plurality of modes may be sequentially changed whenever input signals are input through the input unit 560. Such a physical input unit 560 can be effectively used when the visibility of the transparent display apparatus 500 is rapidly decreased. When the visibility is rapidly decreased, since it is difficult for the user to see menus displayed on the transparent display unit, it may be difficult to select a necessary mode.

Figure 6A:
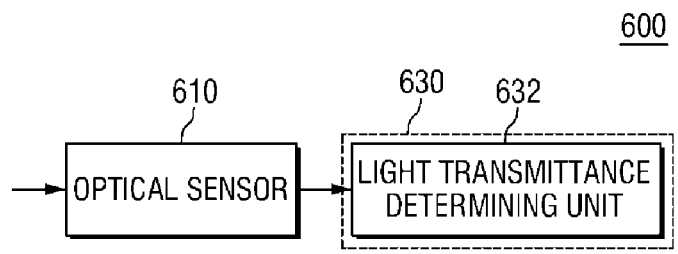
FIG. 6A is a block diagram of a light transmittance control device according to an exemplary embodiment of the present invention.

FIG. 6A is a block diagram of a light transmittance control device according to an exemplary embodiment of the present invention. A light transmittance control device 600 according to the exemplary embodiment of the present invention includes an optical sensor 610 and a processing unit 630 including a light transmittance determining unit 632.

The light transmittance control device 600 means a device that is connected to the light control unit and/or the transparent display unit in the transparent display apparatus, receives the light characteristics from the optical sensor 610, analyzes the received light characteristics, and determines the light transmittance of the light control unit on the basis of the analysis of the light characteristics. The light transmittance control device 600 according to the exemplary embodiment of the present invention senses the amount of light through the optical sensor 610, calculates the contrast ratio on the basis of the sensed amount of light through the processing unit 630, compares the calculated contrast ratio with a target contrast ratio, and determines the transmittance of the light control unit through the light transmittance determining unit 632 so as to achieve the target contrast ratio.

The optical sensor 610 measures characteristics of the light incident on one surface of the transparent display apparatus. The optical sensor 610 measures the amount of light, the luminance of the light, a distribution of the light, and whether or not the object approaches. The optical sensor 610 outputs the measured characteristics of the light as an analog value, and the output value is converted into a digital value by an ADC (analog to digital) converter. The converted value is input to the processing unit 630 including the light transmittance determining unit 632. For example, the light transmittance control device 600 calculates predetermined transmittance for the amount of light by substituting the sensed amount of light from the optical sensor 610 for a lookup table that is previously stored.

The light transmittance determining unit 632 determines the light transmittance of the light control unit on the basis of the measured characteristics of the light. As described above, the light transmittance is controlled by the light control unit of the transparent display apparatus through the light control data signal. That is, the light control data signal is generated based on the determined transmittance. The light control data signal is calculated by substituting the light transmittance for the look-up table that is previously stored.

The light transmittance of the transparent display apparatus is determined in consideration of the target contrast ratio, especially. By achieving the target contrast ratio, a transparency of the transparent display apparatus can be maintained while ensuring the visibility of the video. Further, as described above, the light transmittance of the transparent display apparatus according to the exemplary embodiment of the present invention can be determined in consideration of various characteristics including luminance, color temperature, and chroma in addition to the target contrast ratio.

Figure 6B:
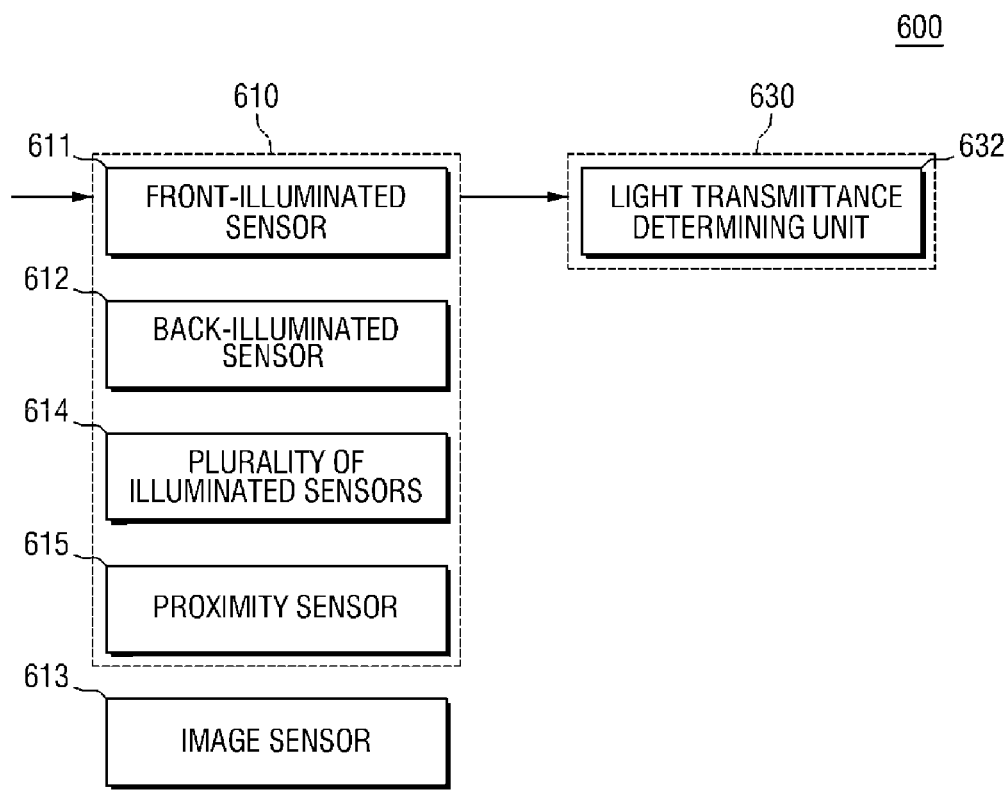
FIG. 6B is a block diagram of a light transmittance control device according to various exemplary embodiments of the present invention.

FIG. 6B is a block diagram of a light transmittance control device according to various exemplary embodiments of the present invention. Referring to FIG. 6B, a light transmittance control device 600 includes an optical sensor 610 and a processing unit 630 including a light transmittance determining unit 632. The optical sensor 610 may be a front-illuminated sensor 611, a back-illuminated sensor 612, a plurality of illuminated sensors 614, and a proximity sensor 615. Further, an image sensor 613 may be used instead of the illuminated sensor. In FIG. 6B, although it has been illustrated that the optical sensor 610 includes a plurality of different sensors, the optical sensor 610 may be an independent sensor among the aforementioned sensors. The optical sensor may be at least one sensor among the front-illuminated sensor 611, the back-illuminated sensor 612, the plurality of illuminated sensors 614 and the proximity sensor 615.

The optical sensor 610 may be the front-illuminated sensor 611 disposed on the front surface of the transparent display apparatus. The front-illuminated sensor 611 measures brightness of light incident on the front surface of the transparent display apparatus. When reflected light is generated from an interface of the transparent display apparatus, similarly to a case where light enters from the back surface of the transparent display apparatus, the contrast ratio is decreased. Specifically, incident light by the sunlight or the illumination may decrease the luminance of the displayed video, or may decrease the visibility of the displayed video by being reflected from the interface of the transparent display apparatus. Further, the contrast ratio may be decreased. The light, which has entered the front surface of the transparent display apparatus and has been reflected may not be controlled, and the light incident on the back surface of the transparent display apparatus may be controlled by the light control unit. When the luminance of the light incident on the front surface is high and thus likely to cause a decrease in the visibility by the reflected light, the transparent display apparatus is configured to increase the maximum luminance of the displayed video. Further, when the luminance of the incident light is low to achieve favorable visibility, the transparent display apparatus may be configured to decrease the maximum luminance of the video to save a driving power.

The optical sensor 610 may be the back-illuminated sensor 612 positioned on the back surface of the transparent display apparatus. The back-illuminated sensor 612 positioned on the back surface of the transparent display apparatus measures the brightness of the light incident on the back surface of the transparent display apparatus. The brightness of the light may be measure in lux as described above.

Hereinafter, an example operation of the light transmittance control device 600 according to the exemplary embodiment of the present invention will be described. If the measured amount of light incident on the back surface is 0 lux, the transmittance of the light control unit is set to 100%. At this time, when the brightness sensed on the back surface of the transparent display apparatus by the back-illuminated sensor 612 of the transparent display apparatus is 200 lux, the transmittance is varied.

In the transparent display apparatus according the exemplary embodiment of the present invention, when a target contrast ratio is set to, for example, 10:1, the light transmittance determining unit 632 of the transparent display apparatus determines the transmittance of the light control unit on the basis of the measured luminance of the light such that the transparent display apparatus has a target contrast ratio of 10:1.

$$\text{target contrast ratio} = 10:1 = \frac{400 + 200 \times 0.4 \times A}{0.1 + 200 \times 0.4 \times A} \quad \text{[Equation 1]}$$

Transmittance A determined by Equation 1 may be about 55%.

Further, except for a case where the brightness of the light measured by the back-illuminated sensor 612 is changed to 400 lux, when other conditions are the same, the transmittance A of the light control unit that is determined to realize a target contrast ratio of 10:1 is about 28%. In this case, the total transmittance of the entire transparent display apparatus is 11% in consideration of the self transmittance of the transparent display apparatus and the variable transmittance of the light control unit.

When the brightness of the light incident on the back surface measured by the back-illuminated sensor 612 is increased, the light transmittance control device 600 maintains the set contrast ratio by decreasing the transmittance of the light control unit and thereby decreasing the portion of the external light incident on the back surface that passes through the transparent display unit. On the contrary to the aforementioned example, when the brightness of the light incident on the back surface is decreased, the light transmittance control device 600 is dynamically controlled to maintain the target contrast ratio by increasing the transmittance of the light control unit. As the target contrast ratio is maintained, the light transmittance control device 600 is driven as the transparent display apparatus having suitable transmittance while maintaining sufficient visibility.

Further, the transmittance of the light may be determined by taking account of average luminance of the video. The contrast ratio of the displayed video is not taken account of. The light transmittance control apparatus 600 according to the exemplary embodiment of the present invention can determine the light transmittance of the light control unit by taking account of the maximum luminance, and the minimum luminance or the average luminance of the displayed video.

The optical sensor 610 may be the plurality of illuminated sensors 614 positioned on one surface of the transparent display apparatus. The plurality of illuminated sensors 614 measures the brightness of the light incident at different positions on one surface of the transparent display apparatus. For example, the plurality of illuminated sensors 614 may be respectively arranged at corners of the transparent display apparatus having a rectangular shape. Alternatively, the plurality of illuminated sensors 614 is not limited to the aforementioned example, but may be formed in various areas of the transparent display apparatus. For example, the plurality of illuminated sensors 614 may be appropriately arranged at certain distances. Furthermore, the plurality of illuminated sensors 614 may be arranged at optimized positions to correspond to the arrangement of the elements of the transparent display apparatus. For example, when non-transparent elements are arranged in a certain area, the plurality of illuminated sensors 614 may be arranged at the area where the non-transparent elements are arranged. The plurality of illuminated sensors 614 can measure brightness values of different incident light rays. That is, the plurality of illuminated sensors can measure brightness values of the incident light rays at the respective positions where the respective illuminated sensors are arranged. The brightness values of the light rays at the plurality of positions measured by the plurality of illuminated sensors 614 is input to the light transmittance determining unit 632.

The light transmittance determining unit 632 can determine the light transmittance values in the areas where the plurality of illuminated sensors 614 are positioned on the basis of the brightness values of the light rays measured by the plurality of illuminated sensors 614 and the positions of the plurality of illuminated sensors 614. The transparent display apparatus may be applied to a large-sized transparent display apparatus, for example, a large-sized transparent display apparatus disposed on the outside. In the transparent display apparatus disposed on the outside, since incident positions of sunlight are changed along with the movement of the sun, the transparent display apparatus may be shaded by buildings and trees. Accordingly, as the position of the incident light is changed, the visibility of the transparent display apparatus may be considerably affected. The light transmittance determining unit 632 of the transparent display apparatus according to the exemplary embodiment of the present invention can adjust the light transmittance at the positions on the basis of the measured brightness of the external light at the plurality of positions so as to enhance uniformity of the luminance or contrast ratio of the displayed video.

The optical sensor 610 may be the plurality of illuminated sensors 614 positioned on the front surface and the back surface of the transparent display apparatus. The illuminated sensor positioned on the front surface measures the brightness of the light incident on the front surface of the transparent display apparatus, and the illuminated sensor positioned on the front surface measures the brightness of the light incident on the back surface of the transparent display apparatus.

In order to achieve the target contrast ratio, the light transmittance determining unit 632 determines the light transmittance of the light control unit by using values from the plurality of illuminated sensors 614 positioned on the front surface and the back surface of the transparent display apparatus and the following equation.

$$\text{target contrast ratio} = X : 1 = \frac{L_{max} + L_{front} \times T_{reflect} + L_{back} \times T_{self} \times T_{var}}{L_{min} + L_{front} \times T_{reflect} + L_{back} \times T_{self} \times T_{var}} : 1$$

wherein Lmax is maximum luminance, Lmin is minimum luminance, Lfront is luminance of light incident on front surface of transparent display apparatus, Lback is luminance of light incident on back surface of transparent display apparatus, Treflect is light reflectivity of transparent display apparatus, Tself is self transmittance of transparent display apparatus, and Tvar is light transmittance of light control unit. The illuminated sensor and the illuminated sensor that are respectively positioned on the front surface and the back surface sense the Lfront and the Lback to supply the sensed Lfront and Lback to the light transmittance determining unit 632.

When the plurality of illuminated sensors 614 are the illuminated sensors that are positioned on the front surface and the back surface, the light transmittance determining unit 632 achieves the set target contrast ratio by further taking account of light incident on the front surface. The light transmittance determining unit 632 receives the values of the Lfront and the Lback from the plurality of illuminated sensors 614 and determines the Tvar so as to achieve the target contrast ratio by using the aforementioned equation. Moreover, the light transmittance determining unit 632 can be controlled to adjust the value of the Lmax to achieve the target contrast ratio. That is, in addition to adjusting the light transmittance of the light control unit, by adjusting the maximum luminance of the transparent display unit, the target contrast ratio can be achieved. The light transmittance determining unit 632 continuously receives the values of the Lfront and Lback so as to maintain the target contrast ratio and adjusts the Tvar and the Lmax so as to correspond to the changed values when the values are changed.

Figure 7A:
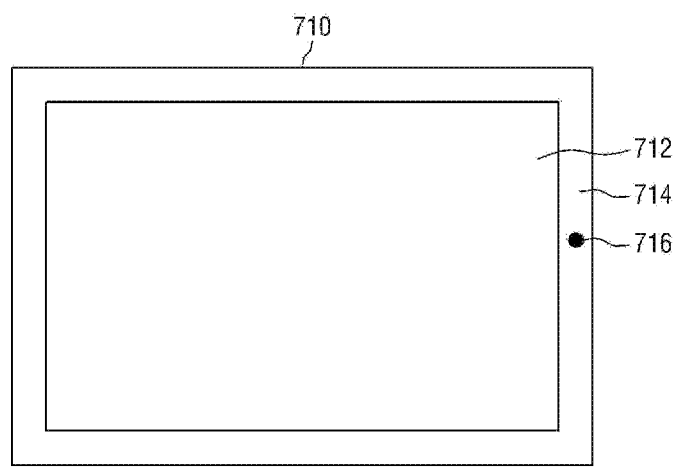
FIGS. 7A to 9B are schematic diagrams of a transparent display apparatus according to various exemplary embodiments of the present invention.
Figure 7B:
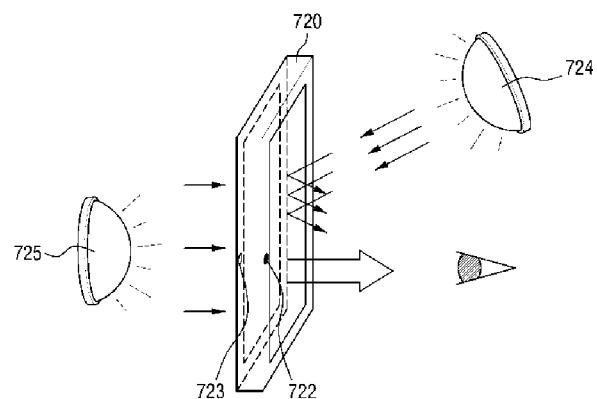

FIG. 7B is a conceptual diagram for describing a position of the optical sensor in the transparent display apparatus according to the exemplary embodiment of the present invention and driving of the transparent display apparatus according to the position of the optical sensor. Referring to FIG. 7B, a transparent display apparatus 720 includes a front-illuminated sensor 722 disposed on a front surface of the transparent display apparatus 720 and a back-illuminated sensor 723 disposed on a back surface. A thick arrow in the transparent display apparatus 720 indicates that the transparent display apparatus 720 displays the video in a direction of the viewer. The front-illuminated sensor 722 is disposed in a non-display area of the transparent display unit. A front light source 724 emits light toward the front surface of the transparent display apparatus 720. The light incident on the front surface of the transparent display apparatus 720 may be called direct light. A part of the direct light passes through the transparent display apparatus 720 and the remaining part of the direct light is reflected from an interface of the transparent display apparatus 720 in a front-surface direction as shown in FIG. 7B.

A light source 725 on a back surface emits light toward a back surface of the transparent display apparatus 720. The light incident on the back surface of the transparent display apparatus 720 may be called backlight. A part of the backlight may be reflected from the interface of the transparent display apparatus 720 in a back-surface direction, but the backlight passes through the transparent display apparatus 720 in a level of transmittance.

Referring to FIG. 7B, the direct light and the backlight are reflected from or passes through the transparent display apparatus 720, and the direct light and the backlight are seen together with the video displayed on the transparent display unit by the user. In the backlight, in order to compensate for a variation or a decrease in the contrast ratio while maintaining informativeness of the object on the back surface, the transparent display apparatus 720 controls the transmittance of the light incident onto the transparent display apparatus 720 on the basis of the brightness measured by the back-illuminated sensor 723 disposed on the back surface. Moreover, the transparent display apparatus 720 is configured to secure the visibility of the transparent display apparatus 720 by increasing the luminance of the displayed video depending on the brightness of the incident direct light.

When both the plurality of illuminated sensors 722 and 723 that are positioned on the front surface and the back surface are used, the transparent display apparatus 720 can achieve the set target contrast ratio by detecting the ambient brightness environment with more accuracy. In addition, the transparent display apparatus 720 can provide informativeness of the video and informativeness of the background to the user.

Referring back to FIG. 6B, the image sensor 613 means a sensor that obtains a two-dimensional video. Since the image sensor 613 is disposed on the back surface of the transparent display apparatus, an image on the back surface that is capable of being seen through the transparent display apparatus can be obtained.

The light transmittance determining unit 632 may determine the light transmittance on the basis of the obtained image. The light transmittance determining unit 632 may divide the obtained image into a plurality of areas, and determine the light transmittance for each of the divided areas.

The optical sensor 610 may include a proximity sensor 615 disposed on the back surface of the transparent display apparatus. The proximity sensor 615 means a sensor that uses infrared rays for sensing a distance and measures whether or not the object is in proximity to the transparent display apparatus depending on the amount of the reflected infrared rays. The light transmittance control device 600 may control the light transmittance of the transparent display apparatus on the basis of whether or not the object positioned on the back surface of the transparent display apparatus is in proximity to the transparent display apparatus. For example, when it is determined by the proximity sensor 615 that the user's hand is in proximity to the transparent display apparatus, the light transmittance is decreased by the light control unit. Meanwhile, when it is determined that the user's hand does not is in proximity to the transparent display apparatus, the light transmittance is maintained, and the proximity sensor 615 may be used as an input unit for manipulating the light control unit.

FIG. 7A is a schematic diagram for describing a position of the optical sensor 716 in the transparent display apparatus 710 according to the exemplary embodiment of the present invention. The transparent display apparatus 710 according to the exemplary embodiment of the present invention includes a light-transmissive display area 712 and a non-display area 714.

In the transparent display apparatus 710 according to the exemplary embodiment of the present invention, the position of the optical sensor 716 is not limited. The optical sensor 716 may be disposed at any position as long as the optical sensor is disposed on one surface of the transparent display apparatus 710 to measure light incident to the optical sensor 716. In the transparent display apparatus 710 according to the exemplary embodiment of the present invention, the optical sensor 716 may be disposed on the front surface, the back surface or a side surface of the transparent display apparatus 710. For example, when the transparent display apparatus 710 includes a plurality of sensors, the plurality of optical sensors 716 may be independently driven, and the transparent display apparatus 710 may recognize positional information items of the optical sensors 716. Specifically, the optical sensor 716 is preferably disposed on the back surface. The light incident from the back surface of the transparent display apparatus 710 affects the contrast ratio of the apparatus. In addition, since the transparent display apparatus 710 maintains the target contrast ratio by controlling the light incident from the back surface, the optical sensor 716 is preferably disposed so as to sense the light incident from the back surface.

In FIG. 7A, the optical sensor 716 of the transparent display apparatus 710 is disposed in the non-display area 714 on one surface of the transparent display apparatus 710. In order to measure the light incident onto the transparent display apparatus 710 with more accuracy, the optical sensor 716 may be disposed at the center of the transparent display apparatus 710.

Figure 8:
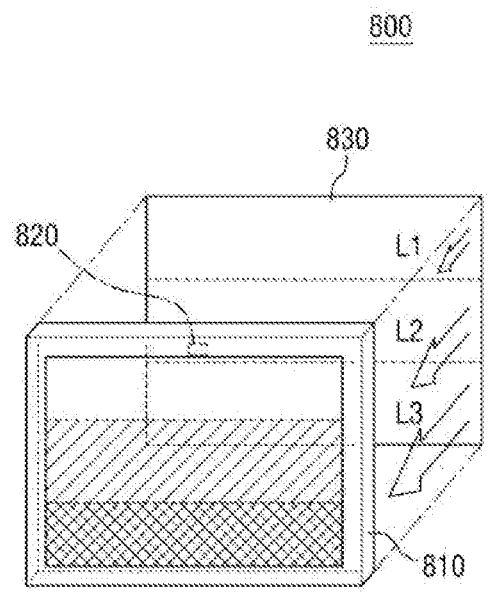

FIG. 8 is a schematic diagram of a transparent display apparatus according to various exemplary embodiments of the present invention. Referring to FIG. 8, a transparent display apparatus 810 includes an image sensor 820 disposed on a back surface of the transparent display apparatus 810. The image sensor 820 obtains an image on the back surface of the transparent display apparatus 810. An image 830 obtained by the image sensor 820 is recognized and processed by the transparent display apparatus 810. However, for the sake of convenience in description, FIG. 8 illustrates that the image 830 obtained by the image sensor 820 corresponds to the transparent display apparatus 810.

The transparent display apparatus 810 may analyze the obtained image 830 and divide the image into a plurality of areas L1, L2 and L3. The obtained image 830 includes the plurality of areas L1, L2 and L3, and the plurality of areas has different brightness values. For example, the area L1 may have the smallest brightness value, the area L2 may have an average brightness value, and the area L3 may have the largest brightness value. Arrows depicted in the areas L1, L2 and L3 represent relative brightness values. The transparent display apparatus 810 according to the present invention controls the light transmittance of areas of the transparent display apparatus 810 corresponding to the divided areas of the obtained image 830. Referring to FIG. 8, the transparent display apparatus may determine the light transmittance such that the area of the transparent display apparatus 810 corresponding to the area L1 has the maximum light transmittance, the area of the transparent display apparatus 810 corresponding to the area L2 has the middle light transmittance, and the area corresponding to the area L3 has the minimum light transmittance.

Further, the transparent display apparatus 810 obtains a plurality of images having time lags from the image sensor 820, compares the obtained plurality of images with each other, and detects that the transparent display apparatus 810 is moving or a position of the transparent display apparatus 810 is changed. When a change in position of the transparent display apparatus 810 is detected, the transparent display apparatus 810 can adjust the light transmittance to ensure the visibility.

When the light transmittance is controlled by measuring the light characteristics by the image sensor 820, a distribution of the light incident onto one image sensor 820 is predicted without using the plurality of illuminated sensors. Furthermore, although it has been explained in FIG. 8 that the distribution of the light is measured by the image sensor 820, the distribution of the light may be measured by other optical sensors.

Figure 9A:
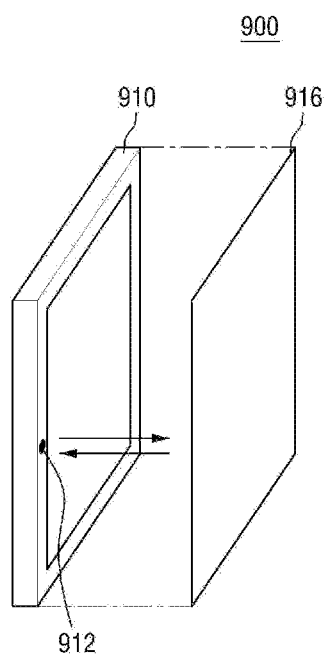
Figure 9B:
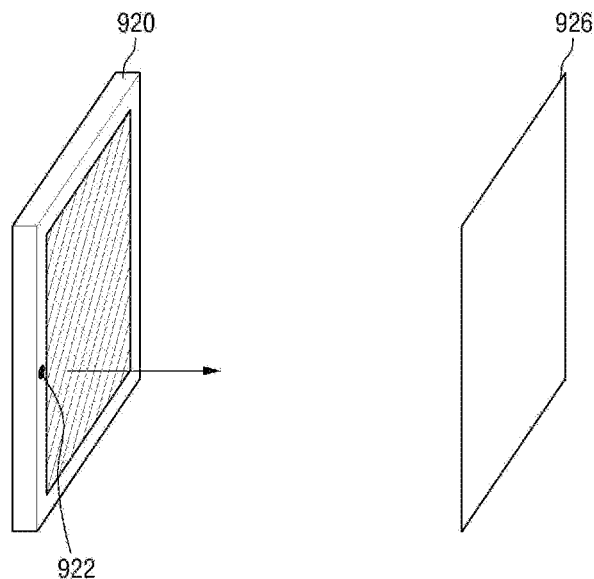

FIGS. 9A and 9B are schematic diagrams of a transparent display apparatus according to various exemplary embodiments of the present invention.

Referring to FIG. 9A, a transparent display apparatus 910 includes a proximity sensor 912 disposed on a back surface of the transparent display apparatus 910. The proximity sensor 912 includes a light emitting part and a light receiving part. The proximity sensor 912 means a sensor that uses infrared rays for sensing a distance or whether or not the object is in proximity to the sensor and measures the distance or whether or not the object is in proximity to the sensor depending on the amount of the reflected infrared rays. The light emitting part of the proximity sensor 912 emits light in one direction. The light reaches an object 916, is reflected from the object, and then enters the light receiving part of the proximity sensor 912. The light receiving part may compare the measured amount of light and the amount of emitted light and measure whether the object is positioned within a distance between the proximity sensor 912 and the object 916 or a predetermined proximity distance. The transparent display apparatus 910 controls the light transmittance of the transparent display apparatus 910 on the basis of whether or not the object 916 is in proximity to the back surface of the transparent display apparatus 910.

The proximity sensor 912 of FIG. 9A measures a distance of the object 916, and FIG. 9A illustrates that the distance between the transparent display apparatus 910 and the object 916 is within a certain distance. For example, when the transparent display apparatus 910 determines that the object 916 on the back surface of the transparent display apparatus 910 is positioned within the certain distance using the proximity sensor 912 including the light emitting part and the light receiving part, the transparent display apparatus can increase the light transmittance by adjusting the light transmittance of the light control unit.

Referring to FIG. 9B, the proximity sensor 912 of a transparent display apparatus 920 measures the distance of the object, and FIG. 9B illustrates that a distance between the transparent display apparatus 920 and an object 926 is outside a certain distance. For example, when the transparent display apparatus 920 determines that the object 926 on the back surface of the transparent display apparatus 920 is positioned within the certain distance using the proximity sensor 912 including the light emitting part and the light receiving part, the transparent display apparatus can decrease or increase the light transmittance by adjusting the light transmittance of the light control unit.

The proximity sensor 912 illustrated in FIGS. 9A and 9B may be used in combination with the optical sensor that measures characteristics of different light rays. For example, the proximity sensor 912 may be used by being connected to the illuminated sensor that measures the brightness. For example, when the a smart phone device including the transparent display apparatus is placed on a table, when the illuminated sensor measures low brightness and the proximity sensor detects high proximity, the light transmittance of the transparent display apparatus may be determined to be decreased. Even under the same brightness level, the transparent display apparatuses 910 and 920 may determine light transmittance values such that a light transmittance value when the object 916 or 926 presumed to be a light source is farther from the transparent display apparatus and a light transmittance value when the object is close to the transparent display apparatus are different from each other.

Figure 10:
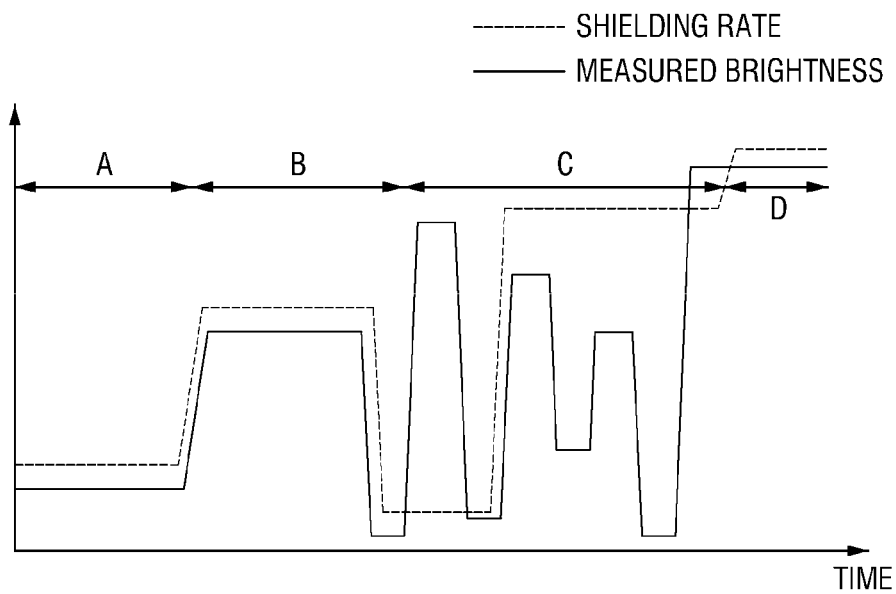
FIG. 10 is a graph for describing a change of shielding rate and a measured value of the optical sensor of the present invention.

FIG. 10 is a graph for describing a change of shielding rate and a measured value of the optical sensor of the present invention. Characteristics of the light measured by the optical sensor in the transparent display apparatus according to the exemplary embodiment of the present invention are varied with time. The transparent display apparatus according to the exemplary embodiment of the present invention may set the transmittance or shielding rate of the transparent display apparatus to a constant predetermined level for a second time when the measured light characteristics are continuously varied, that is, when a predetermined number of variable frequencies are detected for a first predetermined period of time. The transparent display apparatus preferably maintains the shielding rate at a high level. Hereinafter, an operation of the transparent display apparatus according to the exemplary embodiment of the present invention that is operated to correspond to a rapid change in the brightness environment is described.

Referring to FIG. 10, an x-axis is an axis of time, and a y-axis is an axis of a light shielding rate of the light control unit and brightness measured by the optical sensor. The graph illustrates zones A, B, C and D divided for each measured time. A solid line graph of the measured brightness may be measured brightness of light incident on the back surface of the transparent display apparatus according to the exemplary embodiment of the present invention. A dotted line graph may be shielding rate of the light incident on the back surface in the transparent display apparatus according to the exemplary embodiment of the present invention.

In the zone A, the measured brightness is maintained at low and the shielding rate is constantly maintained to correspond to the measured brightness. As the measured brightness is rapidly increased at a start time of the zone B, the shielding rate is increased to ensure the visibility of the video. As the measured brightness is decreased at an ending time of the zone B, the shielding rate is decreased. However, immediately after the zone B where the measured brightness is varied is finished, the measured brightness is rapidly increased at a starting time of the zone C, and the measured brightness is continuously varied in the zone C. When the shielding rate is continuously varied along with a variation in the measured brightness, it may be difficult to maintain the visibility of the displayed video. Accordingly, when the measured brightness is continuously varied for the first time (e.g., at start of zone C), the transparent display apparatus according to the exemplary embodiment of the present invention can maintain the visibility of the video even though the brightness environment is rapidly changed by increasing and maintaining the shielding rate of the transparent display apparatus for the second time (e.g., at end of zone C).

In FIG. 10, although it has been illustrated that the measured light characteristics are the brightness of the light incident on the back surface, the light characteristics that can be measured by the transparent display apparatus according to the exemplary embodiment of the present invention are not limited. The light characteristics may be a distance between the back surface and the object, and the brightness of the light incident on the front surface in addition to the brightness.

Figure 11:
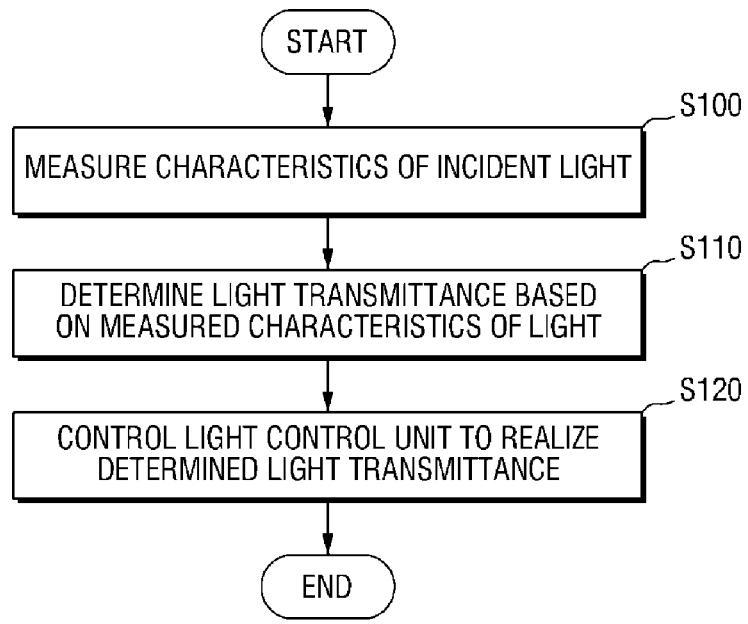
FIG. 11 is a flowchart illustrating a method for controlling a transparent display apparatus according to an exemplary embodiment of the present invention.

FIG. 11 is a flowchart illustrating a method for controlling a transparent display apparatus according to an exemplary embodiment of the present invention. For the sake of convenience in description, the method for controlling a transparent display apparatus is described with reference to the optical sensor, the transparent display and the optical control unit of the transparent display apparatus. Further, all steps may be independently performed, but are described as one procedure in the following description for the sake of convenience in description.

The optical sensor of the transparent display apparatus measures characteristics of incident light (S100). The characteristics of incident light are converted into analog electric signals by the optical sensor, and the converted analog signals are converted into digital signals by the ADC converter. The converted digital signals are input to the processing unit. The optical sensor may be an optical sensor for measuring brightness of light, a distribution of light, and a distance from the object on the back surface. A direction of the light may be measured depending on the position of the optical sensor.

The processing unit determines light transmittance of the transparent display apparatus on the basis of the measured characteristics of light (S110). The processing unit may determine the light transmittance so as to improve the visibility of the transparent display apparatus depending on the light characteristics. The transparent display apparatus may determine the light transmittance so as to achieve the target contrast ratio, or may determine the light transmittance so as to be approximate to the target brightness environment.

The transparent display apparatus controls the light control unit to realize the determined light transmittance (S120). In order to realize the determined light transmittance, the black charged particles that can change the characteristics of the light are moved by an electric field and the black charged particles are collected or spread, so that the light control unit can transmit or shield the incident light.

Figure 12:
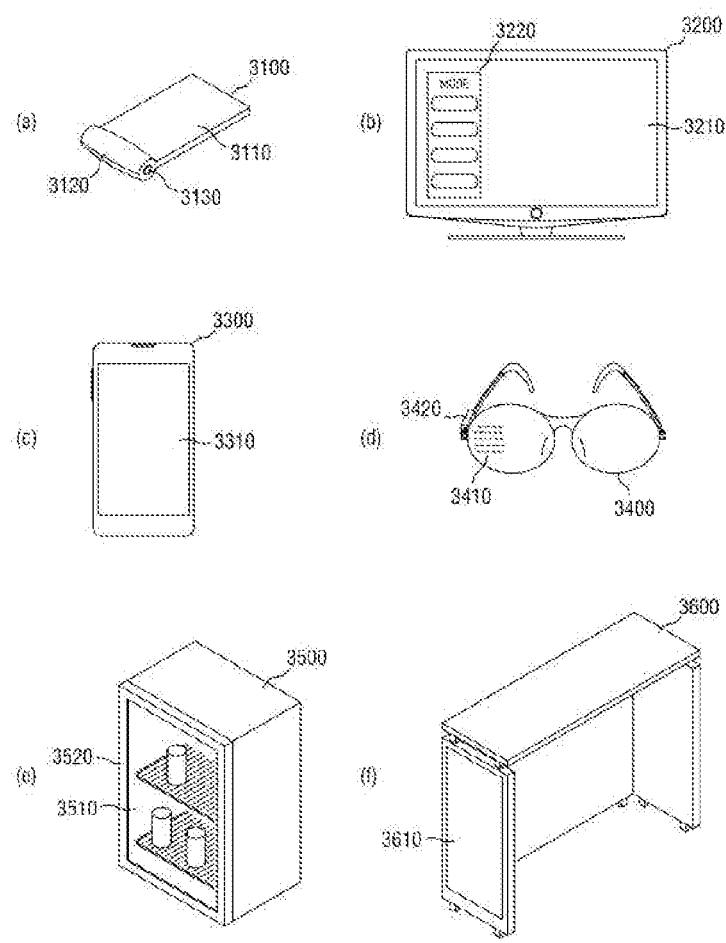
FIG. 12 shows schematic diagrams of apparatuses to which the transparent display apparatus according to the exemplary embodiment of the present invention is applicable.

FIG. 12 shows schematic diagrams of apparatuses to which the transparent display apparatus according to the exemplary embodiment of the present invention is applicable.

(a) of FIG. 12 illustrates a case where the transparent display apparatus according to the exemplary embodiment of the present invention is attached to a transparent device 3100. The transparent device 3100 may include a transparent display apparatus 3110, a control unit 3120 and an input unit 3130. The transparent display apparatus 3110 may be formed such that no bezel is formed on at least one surface of the transparent display apparatus 3110 or the minimum number of bezels is formed on the at least one surface thereof. The transparent device 3100 may include an application for utilizing an augmented reality function through the transparent display apparatus 3110 or other functions of the transparent display apparatus 3110 by the control unit 3120. The transparent device 3100 may select various modes for controlling the transparent display apparatus 3110 by using a separate input unit 3130 such as buttons. The modes for controlling the transparent display apparatus 3110 may include a transmissive mode, a shield mode, an e-book mode, and light-transmittance automatic control mode. The separate input unit 3130 may be used when the visibility of the transparent display apparatus 3110 is rapidly deranged by the ambient brightness environment and it is difficult to select a control window displayed on the transparent display apparatus 3110.

(b) of FIG. 12 illustrates a case where the transparent display apparatus according to the various exemplary embodiment of the present invention is used as a transparent device 3200 or a display apparatus of a screen. The transparent device 3200 may be configured to recognize a video through the transparent display apparatus 3210 and an object on a back surface of the transparent display apparatus 3210, or may be configured to be utilized as a double-sided display. That is, the transparent display apparatus 3210 according to the exemplary embodiment of the present invention may be used by being attached to another display apparatus.

In this case, a design of the transparent display apparatus may be partially changed depending on a kind of another display apparatus. For example, when another display apparatus is a transparent organic light-emitting display apparatus, in order for the transparent display apparatus 3210 to be a double-sided display apparatus, the transparent display apparatus 3210 may configured to allow a plurality of videos to be input. Further, when the double-sided display apparatus is driven, the transparent display apparatus may be driven to be operated in the shield mode in which the light control unit shields the incident light. The transparent device 3200 may be configured to display a control window 3220 capable of selecting various modes for controlling the transparent display apparatus 3210. The modes for controlling the transparent display apparatus 3210 may include a transmissive mode, a shield mode, an e-book mode, and light-transmittance automatic control mode. The user can accomplish the purpose of using the transparent display apparatus 3210 by appropriately selecting the mode for controlling the transparent display apparatus 3210.

(c) of FIG. 12 illustrates a case where the transparent display apparatus according to the various exemplary embodiment of the present invention is used as a display apparatus of a transparent mobile device 3300. (c) of FIG. 12 illustrates that a transparent display apparatus 3310 according to the various exemplary embodiment of the present invention is included in the transparent mobile device 3300, but the transparent display apparatus may be provided at a mobile device or a small-sized device such as a smart phone, a cellular phone, a tablet PC, a PDA. When the transparent display apparatus is provided at the small-sized device, since a built-in battery is used without using an external power supply, the elements of the transparent display apparatus 3310 may be designed to be suitable for the limited capacity of the battery. When the transparent display apparatus 3310 is used as the display apparatus of the transparent mobile device 3300, the transparent display apparatus may include a touch-screen for user input of the transparent mobile device 3300. The touch-screen may be formed on the transparent display apparatus 3310, or may be formed in in-cell type. Further, since the back surface of the transparent display apparatus 3310 can be recognized, the touch-screen may be configured to sense touch of both sides of the transparent display apparatus 3310. Furthermore, the mobile device 3300 may include a proximity sensor, and the operation of the mobile device may be changed depending on whether or not the user or the object approaches or the approaching degree.

(d) of FIG. 12 illustrates a case where the transparent display apparatus according to the various exemplary embodiment of the present invention is used as a display apparatus of smart glasses 3400. The smart glasses 3400 include a transparent display apparatus 3410 and a control unit 3420. When the transparent display apparatus 3410 according to the various exemplary embodiment of the present invention is used in the smart glasses 3400, the transparent display apparatus may be cut off in a rectangular shape or an ellipse shape, and a wiring suitable for various shapes and a driving unit may be set in the transparent display apparatus. Moreover, since a viewing side of the user becomes close to the transparent display apparatus 3410, an optical coating process may be appropriately performed on the transparent display apparatus 3410, or a driving resolution of the video may be appropriately selected.

(e) of FIG. 12 illustrates a case where the transparent display apparatus according to the various exemplary embodiment of the present invention is included in a refrigerator 3500. A transparent display apparatus 3510 may be used as a part of a door 3520 of the refrigerator. When the transparent display apparatus 3510 is used as the door 3520 of the refrigerator, the transparent display apparatus 3510 may include a device that reflects energy other than a device that absorbs light or energy. For example, white charged particles other than the black charged particles may be used as the particle charged of the light control unit of the transparent display apparatus 3510. In addition, in order to easily see an object within the refrigerator 3500 on a back surface of the transparent display apparatus 3510, a dehumidification coating process may be performed on the transparent display apparatus 3510.

(f) of FIG. 12 illustrates a case where the transparent display apparatus according to the various exemplary embodiment of the present invention is used as an advertisement displaying apparatus 3600 of a bus station. (f) of FIG. 12 illustrates that a transparent display apparatus 3610 according to the various exemplary embodiment of the present invention is included in the advertisement displaying apparatus 3600 of a bus station, but the transparent display apparatus may be provided at a fixation device or a large-sized device such as a television or a billboard. Since a power is supplied from an external power supply, the elements of the thin-film transistor may be designed so as to realize higher definition of the transparent display apparatus 3610 due to a stabilized power supply. Further, the advertisement displaying apparatus of a bus station may include a motion sensor capable of interacting with pedestrians. For example, the motion sensor may include TOF (Time of Flight) infrared sensor.

When the transparent display apparatus according to the various exemplary embodiment of the present invention is used as a smart window, the transparent display apparatus may include a supporting member for using as at least the smart window, and the supporting member may include all kinds of films such as a film and a protection film that can be used in the smart window. Moreover, a design of the transparent display apparatus may be partially changed depending on a place in which the smart window is provided. For example, when the transparent display apparatus is provided at a high-humidity place such as a toilet, a basin, a shower room, or a kitchen, the light control unit may be designed using moisture-resistance elements.

In addition, when the smart window is provided at a place that is easily exposed to external impact, such as an external wall of a building, a window glass of a building or a window glass of a vehicle, the transparent display apparatus may be designed using elements that easily absorb impact or have impact resistance.

Further, when the transparent display apparatus is used as the smart window, various optical films for reinforcing optical and/or physical characteristics may be attached to the transparent display apparatus. A reflecting film, a diffusing film, a prism film, a lens-pattern composite film, a double brightness enhancement film, a non-reflecting coat film, an anti-ultraviolet film, or an anti-infrared film may used to reinforce optical and/or physical characteristics. The smart window to which the transparent display apparatus is attached depending on the reinforced characteristics may be used as a window for a vehicle, a smart door, a projection wall, or a smart mirror.

The components of various embodiments of the present invention can be partially or entirely bonded to or combined with each other and can be interlocked and operated in technically various ways as can be fully understood by an ordinary person skilled in the art, and the embodiments can be carried out independently of or in association with each other.

Combinations of each block of the accompanying block diagram and each step of the flow chart can be implemented by algorithms or computer program instructions comprised of firmware, software, or hardware. Since these algorithms or computer program instructions can be installed in processor of a universal computer, a special computer or other programmable data processing equipment, the instructions executed through a processor of a computer or other programmable data processing equipment generates means for implementing functions described in each block of the block diagram or each step of the flow chart. Since the algorithms or computer program instructions can be stored in a computer available or computer readable memory capable of orienting a computer or other programmable data processing equipment to implement functions in a specific scheme, the instructions stored in the computer available or computer readable memory can produce items involving an instruction means executing functions described in each block of the block diagram or each step of the flow chart. Since the computer program instructions can be installed in a computer or other programmable data processing equipment, a series of operation steps are carried out in the computer or other programmable data processing equipment to create a process executed by the computer such that instructions implementing the computer or other programmable data processing equipment can provide steps for implementing functions described in functions described in each block of the block diagram or each step of the flow chart.

Further, each block or each step may indicate a part of a module, a segment, or a code including one or more executable instructions for implementing specific logical function(s). Furthermore, it should be noted that in some alternative embodiments, functions described in blocks or steps can be generated out of the order. For example, two blocks or steps illustrated continuously may be implemented simultaneously, or the blocks or steps may be implemented in reverse order according to corresponding functions.

The steps of a method or algorithm described in connection with the embodiments disclosed in the present specification may be embodied directly in hardware, in a software module executed by a processor, or in a combination of the two. The software module may reside in RAM memory, flash memory, ROM memory, EPROM memory, EEPROM memory, register, hard disk, a removable disk, a CD-ROM, or any other form of storage medium known in the art. An exemplary storage medium is coupled to the processor such that the processor can read information from, and write information to, the storage medium. Otherwise, the storage medium may be integrated with the processor. The processor and the storage medium may reside in an application-specific integrated circuit (ASIC). The ASIC may reside in a user terminal. Otherwise, the processor and the storage medium may reside as discrete components in a user terminal.

The exemplary embodiments of the present invention have been described in more detail with reference to the accompanying drawings, but the present invention is not limited to the exemplary embodiments. It will be apparent to those skilled in the art that various modifications can be made without departing from the technical sprit of the invention. Accordingly, the exemplary embodiments disclosed in the present invention are used not to limit but to describe the technical spirit of the present invention, and the technical spirit of the present invention is not limited to the exemplary embodiments. Therefore, the exemplary embodiments described above are considered in all respects to be illustrative and not restrictive. The protection scope of the present invention must be interpreted by the appended claims and it should be interpreted that all technical spirits within a scope equivalent thereto are included in the appended claims of the present invention.

What is claimed is:

1. A transparent display apparatus, comprising:
   a transparent display unit having light emitting pixel elements and transmitting at least a portion of first light incident on the transparent display apparatus; and
   at least one sensor to generate at least one signal indicative of brightness of second light incident on the transparent display apparatus,
   wherein the portion of the first light transmitted through the transparent display unit is adjustable based on the signal indicative of the brightness of the second light; and
   wherein the portion of the first light transmitted through the transparent display unit is further adjustable based on a target contrast ratio of the transparent display apparatus.

2. The transparent display apparatus of claim 1, wherein the first light is the second light.

3. The transparent display apparatus of claim 1, wherein the first light and the second light are incident on opposite surfaces of the transparent display apparatus.

4. The transparent display apparatus of claim 1, further comprising:
   a light control unit overlapping with the transparent display unit, the light control unit having an adjustable transmittance for the first light, wherein the amount of the portion of the first light transmitted through the transparent display unit is adjustable by adjusting the adjustable transmittance of the light control unit based on the signal indicative of the brightness of the second light.

5. The transparent display apparatus of claim 4, wherein the at least one sensor comprises a plurality of sensors that generate a plurality of signals indicative of the brightness of the second light at different positions of the transparent display apparatus, and wherein the adjustable transmittance of the light control unit is adjustable in different areas corresponding to the different positions of the transparent display apparatus based on the plurality of signals.

6. The transparent display apparatus of claim 1, wherein the at least one sensor also measures a proximity between the transparent display apparatus and an external object, and wherein the portion of the first light transmitted through the transparent display unit is further adjustable based on the proximity.

7. The transparent display apparatus of claim 1, wherein the at least one sensor comprises an image sensor.

8. The transparent display apparatus of claim 1, wherein the portion of the first light transmitted through the transparent display unit is further adjustable based on a maximum luminance of the light emitting pixel elements.

9. The transparent display apparatus of claim 1, wherein the portion of the first light transmitted through the transparent display unit is decreased as the brightness of the second light increases.

10. The transparent display apparatus of claim 1, wherein the transparent display apparatus supports a first mode, a second mode and a third mode, wherein:
in the first mode, the portion of the first light transmitted through the transparent display unit is maximized,
in the second mode, the portion of the first light transmitted through the transparent display unit is minimized, and
in the third mode, the portion of the first light transmitted through the transparent display unit is adjustable based on the signal indicative of the brightness of the second light.

11. The transparent display apparatus of claim 1, wherein the portion of the first light transmitted through the transparent display unit is maintained constant when the brightness of the second light changes more than a predetermined number of times in a predetermined period.

12. A method of operation in a transparent display apparatus that includes a transparent display unit having light emitting pixel elements and transmitting at least a portion of external light incident on the transparent display apparatus, the method comprising:
generating at least one signal indicative of brightness of the external light incident on the transparent display apparatus; and
adjusting the portion of the external light transmitted through the transparent display unit based on the signal indicative of the brightness of the external light,
wherein the portion of the external light transmitted through the transparent display unit decreases as the brightness of the external light increases.

13. The method of claim 12, wherein the transparent display apparatus comprises a light control unit overlapping with the transparent display unit, the light control unit having an adjustable transmittance for the external light, and wherein adjusting the portion of the external light transmitted through the transparent display unit comprises:
adjusting the adjustable transmittance of the light control unit based on the signal indicative of the brightness of the external light.

14. The method of claim 13, wherein the portion of the external light transmitted through the transparent display unit is further adjusted based on a target contrast ratio of the transparent display apparatus.

15. A non-transitory computer readable medium storing instructions for operation of a transparent display apparatus that includes a transparent display unit having light emitting pixel elements and transmitting at least a portion of external light incident on the transparent display apparatus, the instructions when executed by a processor cause the processor to perform a method comprising:
generating at least one signal indicative of brightness of the external light incident on the transparent display apparatus; and
adjusting the portion of the external light transmitted through the transparent display unit based on the signal indicative of the brightness of the external light,
wherein the portion of the external light transmitted through the transparent display unit is further adjustable based on a target contrast ratio of the transparent display apparatus.

* * * * *